US010727386B2

(12) United States Patent
Grötsch

(10) Patent No.: US 10,727,386 B2
(45) Date of Patent: Jul. 28, 2020

(54) RADIATION-EMITTING COMPONENT

(71) Applicant: OSRAM OLED GmbH, Regensburg (DE)

(72) Inventor: Stefan Grötsch, Bad Abbach (DE)

(73) Assignee: OSRAM OLED GmbH, Regensburg (DE)

( * ) Notice: Subject to any disclaimer, the term of this patent is extended or adjusted under 35 U.S.C. 154(b) by 38 days.

(21) Appl. No.: 16/300,661

(22) PCT Filed: May 11, 2017

(86) PCT No.: PCT/EP2017/061362
§ 371 (c)(1),
(2) Date: Nov. 12, 2018

(87) PCT Pub. No.: WO2017/198548
PCT Pub. Date: Nov. 23, 2017

(65) Prior Publication Data
US 2019/0207071 A1  Jul. 4, 2019

(30) Foreign Application Priority Data

May 20, 2016  (DE) .................... 10 2016 109 308

(51) Int. Cl.
*H01L 33/62* (2010.01)
*H01L 25/075* (2006.01)
(Continued)

(52) U.S. Cl.
CPC ............ *H01L 33/62* (2013.01); *G02B 6/4214* (2013.01); *H01L 25/0753* (2013.01); *H01L 33/505* (2013.01); *H01L 33/507* (2013.01); *H01L 33/56* (2013.01); *H01L 33/60* (2013.01); *H01L 33/644* (2013.01); *H01L 27/153* (2013.01); *H01L 27/156* (2013.01); *H01L 33/46* (2013.01);
(Continued)

(58) Field of Classification Search
CPC ....................................................... H01L 33/62
See application file for complete search history.

(56) References Cited

U.S. PATENT DOCUMENTS

2007/0267646 A1  11/2007  Wierer, Jr. et al.
2010/0140648 A1  6/2010  Harada et al.
(Continued)

FOREIGN PATENT DOCUMENTS

CN  103178182 A  6/2013
CN  103443942 A  12/2013
(Continued)

*Primary Examiner* — William A Harriston
(74) *Attorney, Agent, or Firm* — DLA Piper LLP (US)

(57) ABSTRACT

A radiation-emitting component includes a radiation source including at least one semiconductor layer sequence that generates radiation; an optical waveguide device disposed downstream of the radiation source; and a conversion element for radiation conversion disposed downstream of the optical waveguide device, wherein radiation is emittable from the radiation source via an emission surface and couplable into the optical waveguide device, radiation is couplable from the optical waveguide device into the conversion element via an input surface, and the emission surface of the radiation source is larger than the input surface of the conversion element.

22 Claims, 18 Drawing Sheets

(51) Int. Cl.
  *H01L 33/50*  (2010.01)
  *H01L 33/60*  (2010.01)
  *H01L 33/64*  (2010.01)
  *G02B 6/42*  (2006.01)
  *H01L 33/56*  (2010.01)
  *H01L 33/46*  (2010.01)
  *H01L 27/15*  (2006.01)
  *H01L 33/54*  (2010.01)

(52) U.S. Cl.
  CPC .... *H01L 33/54* (2013.01); *H01L 2224/48091* (2013.01); *H01L 2924/181* (2013.01)

(56) References Cited

U.S. PATENT DOCUMENTS

| | | |
|---|---|---|
| 2011/0121732 A1* | 5/2011 | Tsutsumi ............ H01L 25/0753 315/77 |
| 2014/0110736 A1 | 4/2014 | Waragaya |
| 2015/0137164 A1 | 5/2015 | Ichikawa |
| 2015/0204494 A1 | 7/2015 | Wada et al. |
| 2015/0207045 A1 | 7/2015 | Wada et al. |
| 2015/0255437 A1 | 9/2015 | Moosburger |
| 2016/0095184 A1 | 3/2016 | Nakabayashi et al. |

FOREIGN PATENT DOCUMENTS

| | | |
|---|---|---|
| EP | 2 325 883 A2 | 5/2011 |
| JP | 2011-134829 A | 7/2011 |
| JP | 2013-110199 A | 6/2013 |
| JP | 5326705 B2 | 10/2013 |
| JP | 5326837 B2 | 10/2013 |
| WO | 2014/009062 A1 | 1/2014 |

* cited by examiner

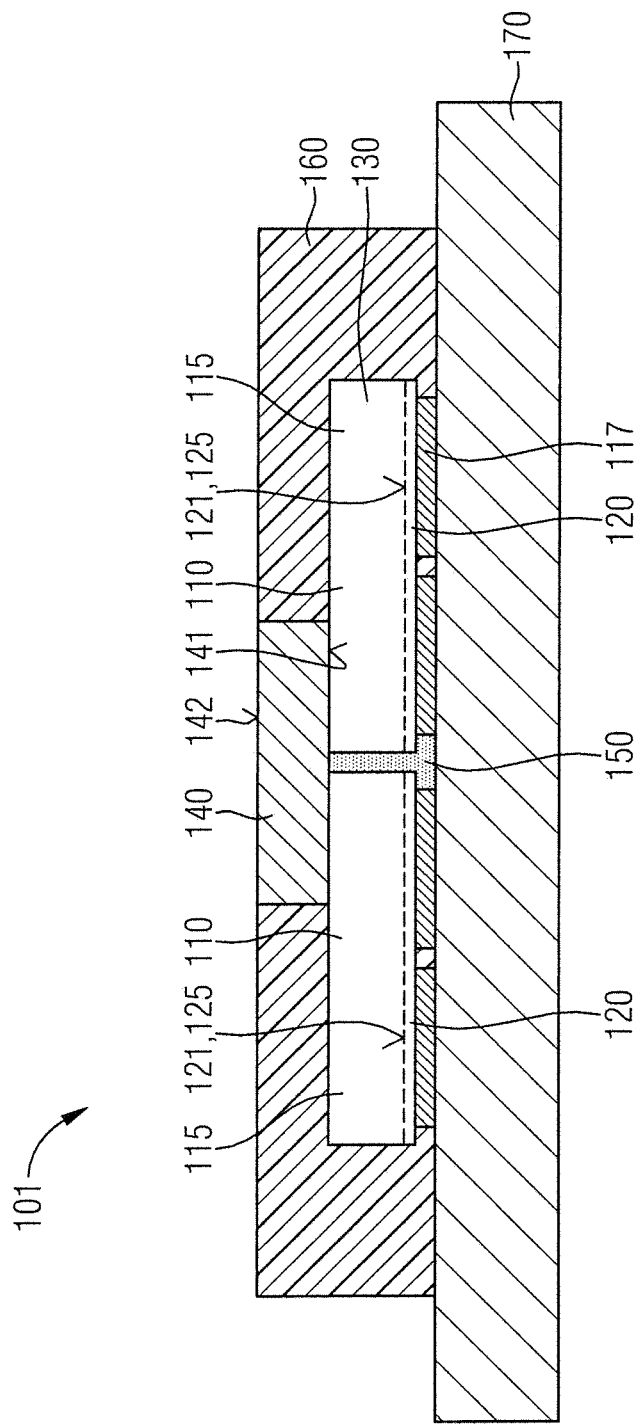

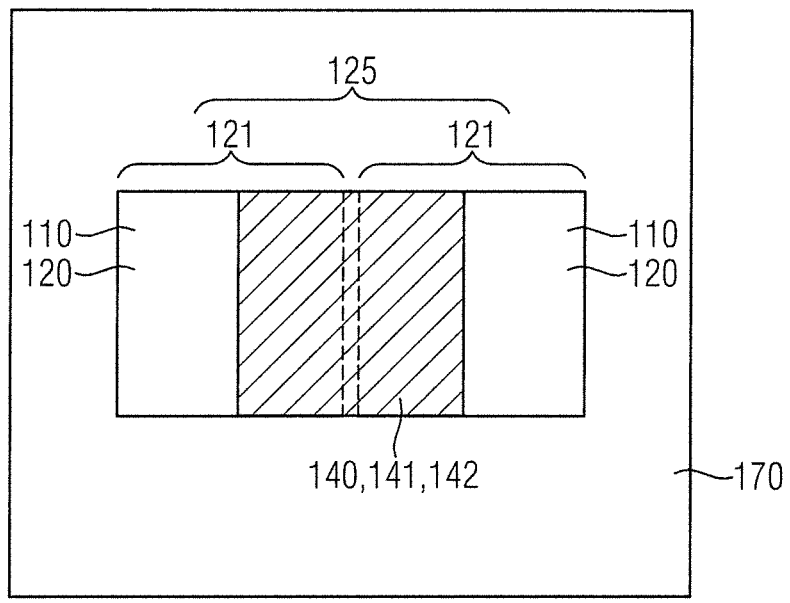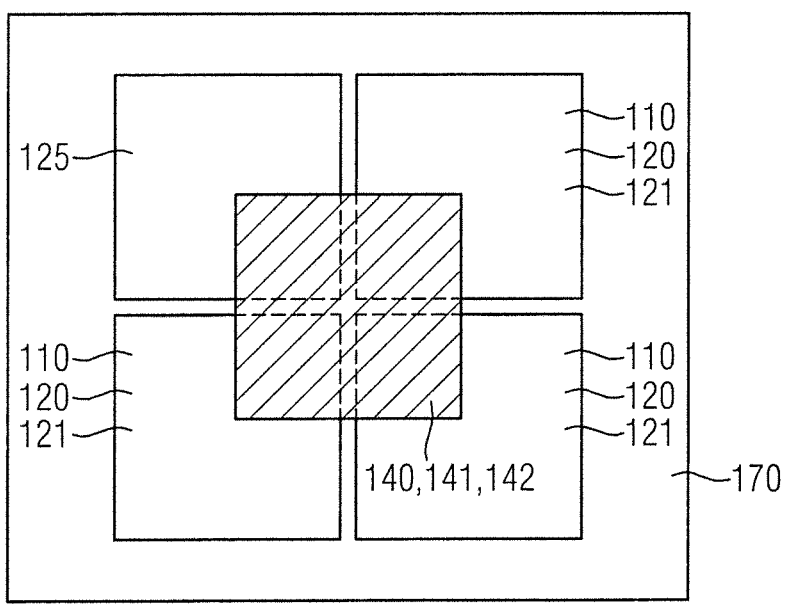

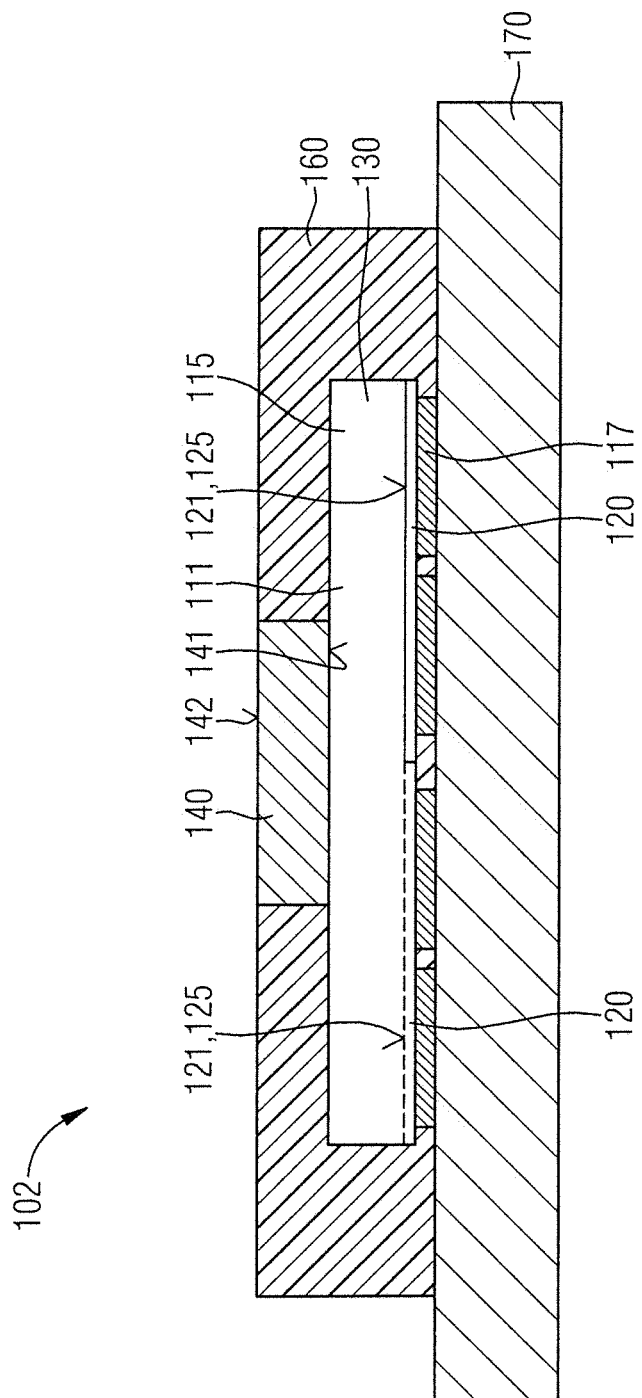

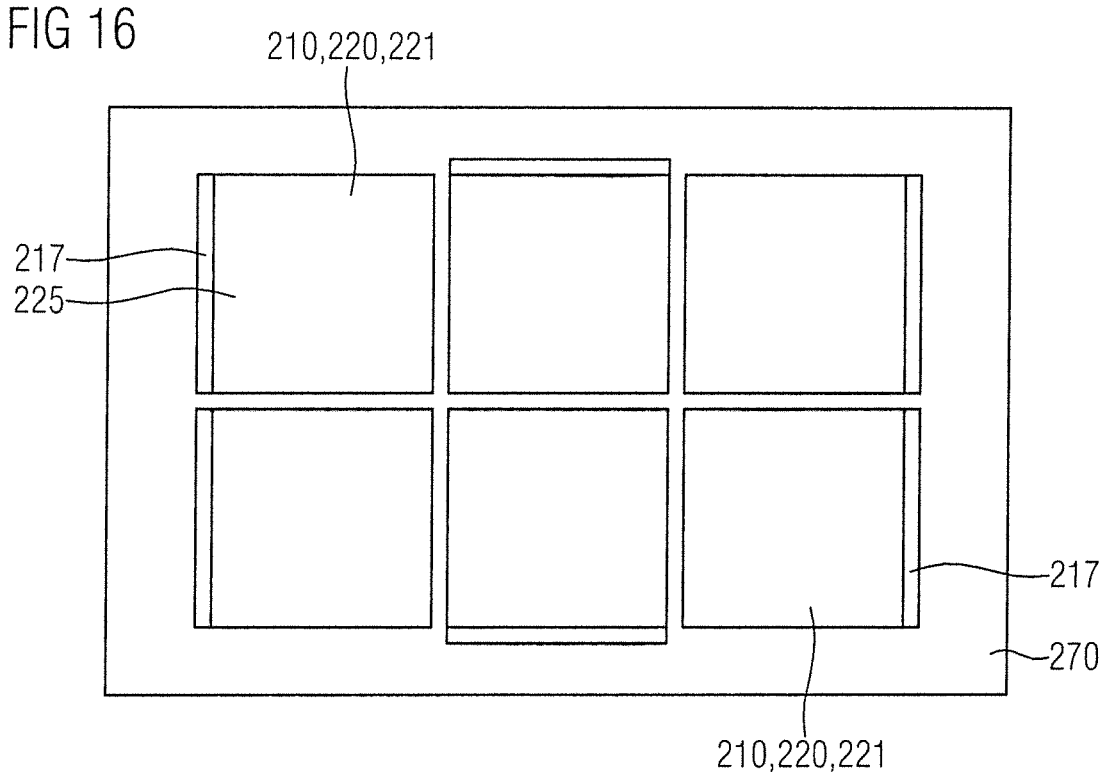
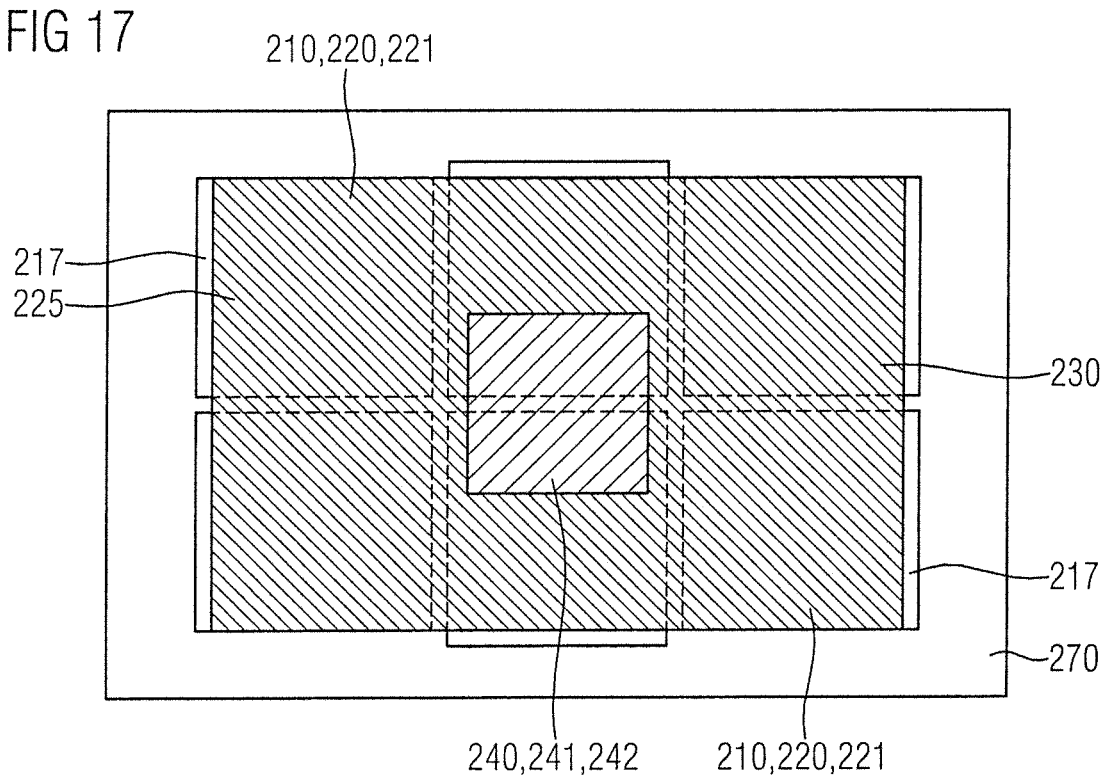

RADIATION-EMITTING COMPONENT

TECHNICAL FIELD

This disclosure relates to a radiation-emitting component comprising at least one semiconductor layer sequence that generates radiation and a conversion element for radiation conversion.

BACKGROUND

A radiation-emitting component may comprise a semiconductor chip comprising a semiconductor layer sequence that generates radiation and a conversion element arranged on the semiconductor chip. The radiation generated by the semiconductor layer sequence of the semiconductor chip may be at least partly converted with the aid of the conversion element. After passing through the conversion element, the radiation, which may comprise converted and non-converted radiation portions, may be emitted from the conversion element.

Depending on the application of the radiation-emitting component, one requirement may consist of achieving radiation emission with high luminance. This may be realized by high-current operation of the semiconductor chip with a current density of 3 A/mm$^2$, for example, which presupposes a design of the semiconductor chip and the component which is suitable therefor. The high-current approach may be unsuitable or undesirable depending on the boundary conditions.

It could therefore be helpful to provide an improved radiation-emitting component.

SUMMARY

I provide a radiation-emitting component including a radiation source including at least one semiconductor layer sequence that generates radiation; an optical waveguide device disposed downstream of the radiation source; and a conversion element for radiation conversion disposed downstream of the optical waveguide device, wherein radiation is emittable from the radiation source via an emission surface and couplable into the optical waveguide device, radiation is couplable from the optical waveguide device into the conversion element via an input surface, and the emission surface of the radiation source is larger than the input surface of the conversion element.

BRIEF DESCRIPTION OF THE DRAWINGS

FIG. 1 shows a lateral illustration of a radiation-emitting component including volume-emitting flip-chips, a conversion element and a reflective plastics material.

FIGS. 2 and 3 show plan view illustrations showing configurations of the component from FIG. 1 with different numbers of semiconductor chips.

FIG. 4 shows a lateral illustration of a further radiation-emitting component including a volume-emitting multi-emitter flip-chip, a conversion element and a reflective plastics material.

FIGS. 16 and 17 show plan view illustrations of constituent parts of the component from FIG. 15.

LIST OF REFERENCE SIGNS

Figure 5:
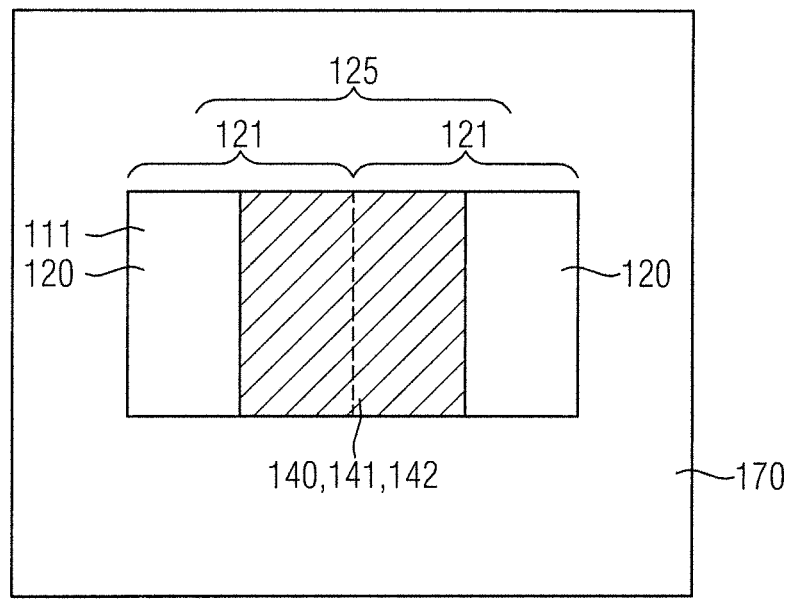
FIGS. 5 and 6 show plan view illustrations showing different configurations of the component from FIG. 4.

101 component
102 component
103 component
104 component
110 semiconductor chip
111 semiconductor chip
115 chip substrate
117 contact
120 semiconductor layer sequence
121 radiation surface
125 emission surface
130 optical waveguide device
140 conversion element
141 input surface
142 radiation surface
150 radiation-transmissive material
160 reflective plastics material
161 reflective coating
170 carrier
201 component
202 component
203 component
204 component
205 component
206 component
207 component
210 semiconductor chip
211 semiconductor chip
215 chip substrate
217 contact
219 contact 220 semiconductor layer sequence
221 radiation surface
225 emission surface
230 optical waveguide
231 optical waveguide
232 optical waveguide
235 cutout
240 conversion element
241 input surface
242 radiation surface
250 radiation-transmissive material
260 reflective plastics material
270 carrier
275 bond wire
280 heat dissipating element
281 reflective layer

DETAILED DESCRIPTION

My component may comprise a radiation source comprising at least one semiconductor layer sequence that generates radiation, an optical waveguide device disposed downstream of the radiation source, and a conversion element for radiation conversion disposed downstream of the optical waveguide device. Via an emission surface, radiation may be emitted from the radiation source and coupled into the optical waveguide device. Via an input surface, radiation may be coupled from the optical waveguide device into the conversion element. The emission surface of the radiation source is larger than the input surface of the conversion element.

The radiation source is located on the input side, and the conversion element on the output side of the optical waveguide device. The optical waveguide device optically connects to the emission surface of the radiation source and the input surface of the conversion element. During operation of the component, a primary radiation generated by the radiation source may be emitted via the emission surface thereof and coupled into the optical waveguide device. With the aid of the optical waveguide device, the radiation may be guided further to the conversion element and be coupled into the conversion element via the input surface thereof. The radiation coupled in may be at least partly converted with the aid of the conversion element. After passing through the conversion element, the radiation, which may comprise primary and secondary, that is to say non-converted and converted radiation portions, may be emitted from the conversion element.

The optical waveguide device arranged between the radiation source and the conversion element affords the possibility of guiding the radiation generated by the radiation source to the conversion element with a high efficiency and introducing the radiation into the conversion element. Since the emission surface of the radiation source is larger than the input surface of the conversion element, the radiation coming from the radiation source may be concentrated on the conversion element during this process. Consequently, a radiation emission from the conversion element with a high luminance may be achieved. This effect may be promoted by the radiation conversion taking place in the conversion element, which radiation conversion may involve absorption of primary radiation and reemission of secondary radiation in all possible spatial directions, and thus by a transgression of the conservation of etendue. The construction of the radiation-emitting component therefore makes it possible to provide a high luminance without application of high-current conditions. To achieve high luminance, the radiation-emitting component may be operated with a customary current density.

Further possible details and examples that may be considered for the radiation-emitting component are described more specifically below.

The feature that the emission surface of the radiation source is larger than the input surface of the conversion element relates to the lateral dimensions of the relevant surfaces. Configurations that enlarge the surface area such as, for example, a surface structure or surface roughness are disregarded here.

The component may be configured such that the optical waveguide device or a rear-side region of the optical waveguide device, in a plan view consideration, covers at least the entire emission surface of the radiation source. As a result, radiation of the radiation source may be efficiently emitted via the entire emission surface and coupled into the optical waveguide device. In the same way, the input surface of the conversion element, in a plan view consideration, may be completely covered or overlapped by the optical waveguide device or a front-side region of the optical waveguide device such that radiation from the optical waveguide device may be efficiently coupled into the conversion element.

Achieving a high luminance may be clearly manifested if the emission surface of the radiation source is significantly larger than the input surface of the conversion element. In this sense, the input surface of the conversion element and the emission surface of the radiation source may comprise a size ratio of at most 75%.

One possible example is a size ratio in the region of 50%. In this way, compared to direct arrangement of a conversion element on a radiation-generating semiconductor layer sequence with corresponding surface dimensions, an increase in the luminance of 20 to 35% may be achieved. A size ratio of less than 50% may also be provided, as a result of which a greater luminance or increase in luminance may be achieved.

The optoelectronic radiation-emitting component may be used, for example, in the automotive field. A further application example is the projection field.

It is possible for the primary radiation generated by the at least one semiconductor layer sequence to be partly or substantially completely converted into one or more secondary radiations with the aid of the conversion element. The primary radiation may be a blue light radiation, for example. In a partial conversion, the blue light radiation may be, for example, partly converted into a yellow light radiation, and a white light radiation may be emitted from the conversion element as a result of a superimposition of the blue and yellow light radiations. Such a configuration may be considered if the radiation-emitting component is used in a headlight, for example. In a full conversion, the blue light radiation may be substantially completely converted into a green or red light radiation, for example.

The conversion element may comprise a front-side radiation surface for radiation emission. The radiation surface, opposite the input surface may comprise a size corresponding to the input surface.

The conversion element may be configured from one or more conversion materials. Furthermore, the conversion element may be a ceramic conversion element. It is also possible for the conversion element to comprise a matrix material, for example, a silicone or glass material, and embedded therein particles comprising one or more conversion materials. Further possible configurations are explained in even greater detail further below.

The radiation source may comprise a plurality of semiconductor layer sequences that generate radiation arranged next to one another. Radiation of the semiconductor layer sequences may each be emitted via a radiation surface and coupled into the optical waveguide device. In this case, the emission surface of the radiation source is composed of the individual radiation surfaces of the semiconductor layer sequences. Achieving a high luminance without high-current conditions may be promoted.

The at least one semiconductor layer sequence of the radiation source may be produced by an epitaxy method. The semiconductor layer sequence may comprise an active zone, in which the radiation may be generated.

Furthermore, the at least one semiconductor layer sequence of the radiation source may be part of a radiation-emitting semiconductor chip, for example, a light-emitting diode chip (LED chip). Depending on the configuration of the radiation-emitting component, the optical waveguide device may furthermore be constituted of one or more semiconductor or light-emitting diode chips. Moreover, the at least one semiconductor layer sequence may directly connect to the optical waveguide device and thereby directly adjoin the optical waveguide device. It is furthermore possible for the at least one semiconductor layer sequence and the optical waveguide device to optically connect via a transparent connection medium such as a silicone material, for example. The examples explained below may be employed in this context.

The radiation-emitting component may comprise a single radiation-emitting semiconductor chip. The semiconductor chip is configured as a volume-emitting flip-chip. The semiconductor chip comprises the at least one semiconductor layer sequence of the radiation source and a radiation-transmissive chip substrate. The optical waveguide device is constituted of the radiation-transmissive chip substrate of the semiconductor chip.

The at least one semiconductor layer sequence may be arranged on the radiation-transmissive chip substrate. As a result, the at least one semiconductor layer sequence may directly adjoin the chip substrate and be directly optically coupled to the chip substrate. This holds true in the same way for the emission surface of the radiation source constituted of the at least one semiconductor layer sequence. The radiation-transmissive chip substrate may be configured from sapphire, for example, such that the semiconductor chip may be a sapphire flip-chip.

In a configuration of the semiconductor chip comprising a plurality of semiconductor layer sequences, the semiconductor layer sequences may be arranged next to one another on the radiation-transmissive chip substrate. In this design, in which the emission surface is composed of the radiation surfaces of the plurality of semiconductor layer sequences, the semiconductor chip may be referred to as a multi-emitter flip-chip.

The conversion element may be arranged on the radiation-transmissive chip substrate serving as an optical waveguide device. In this case, the conversion element may connect and thereby be optically coupled to the chip substrate, for example, via a radiation-transmissive connection material, for example, a silicone material or a glass solder.

A reflective material may be arranged circumferentially with respect to the semiconductor chip and at a front side of the semiconductor chip in a region next to the conversion element. In this way, no radiation may emerge at these locations, and achieving a high luminance may be promoted. In this configuration, by way of example, a reflective coating may be provided on the semiconductor chip. The reflective coating may be a monolayer, and configured from a dielectric or metallic material. A multilayered coating comprising a plurality of dielectric and/or metallic sublayers is also possible.

The radiation-emitting component may comprise a plurality of radiation-emitting semiconductor chips arranged next to one another. The plurality of semiconductor chips are configured as volume-emitting flip-chips. The plurality of semiconductor chips each comprise a semiconductor layer sequence of the radiation source and a radiation-transmissive chip substrate. The optical waveguide device comprises the radiation-transmissive chip substrates of the plurality of semiconductor chips.

Each semiconductor layer sequence may be arranged on an associated radiation-transmissive chip substrate, and thereby directly adjoin the relevant chip substrate and directly optically connect to the chip substrate. This holds true in the same way for the radiation surfaces of the semiconductor layer sequences forming the emission surface of the radiation source composed of the semiconductor layer sequences. The radiation-transmissive chip substrates may be configured from sapphire, for example, such that the semiconductor chips may be sapphire flip-chips.

The conversion element may be arranged on the optical waveguide device composed of the chip substrates of the plurality of semiconductor chips. In this case, the conversion element may connect and thereby be optically coupled to the optical waveguide device, for example, via a radiation-transmissive connection material, for example, a silicone material or a glass solder.

The radiation-emitting component may comprise a radiation-transmissive material arranged between the plurality of semiconductor chips. The radiation-transmissive material that may be ascribed to the optical waveguide device enables an optical connection and a crosstalk between the radiation-transmissive chip substrates of the semiconductor chips. The radiation-transmissive material may be a silicone material.

A reflective material may be arranged circumferentially with respect to the plurality of semiconductor chips and at front sides of the plurality of semiconductor chips in a region next to the conversion element. As a result, no radiation may emerge at these locations, and achieving a high luminance may be promoted. The reflective configuration may be realized, for example, by the plurality of semiconductor chips being provided with a reflective coating. The reflective coating may be realized as a monolayer or multilayered and also in dielectric and/or metallic fashion in accordance with the example described above.

The radiation-emitting component may comprise a plurality of radiation-emitting semiconductor chips arranged next to one another. The plurality of semiconductor chips are configured as surface-emitting semiconductor chips. The plurality of semiconductor chips each comprise a semiconductor layer sequence of the radiation source. The optical waveguide device is configured in the form of an optical waveguide arranged on the plurality of semiconductor chips.

The radiation-emitting component may comprise a single radiation-emitting semiconductor chip. The semiconductor chip is configured as a surface-emitting semiconductor chip. The semiconductor chip comprises the semiconductor layer sequence of the radiation source. The optical waveguide device is configured in the form of an optical waveguide arranged on the semiconductor chip.

In the two examples mentioned above, the optical waveguide may be produced separately from the surface-emitting semiconductor chip or the plurality of surface-emitting semiconductor chips. The optical waveguide may be realized in laminar fashion or in the form of a surface optical waveguide. The optical waveguide may be configured from a radiation-transmissive material, for example, sapphire or a glass material. A surface of the optical waveguide may be optically plane. The optical waveguide may connect and thereby be optically coupled to the semiconductor chip or the plurality of semiconductor chips via a radiation-transmissive connection material, for example, a silicone material. The radiation-generating semiconductor layer sequence of the semiconductor chip or semiconductor chips may face the optical waveguide.

The conversion element may be arranged on the optical waveguide. In this case, the conversion element may connect and hence be optically coupled to the optical waveguide, for example, via a radiation-transmissive connection material, for example, a silicone material or a glass solder.

The optical waveguide may be configured from a radiation-transmissive ceramic material. If the conversion element is likewise a ceramic, the optical waveguide and the conversion element may be realized in the form of a combined and jointly produced ceramic element. In this case, the conversion element may directly adjoin the optical waveguide and directly optically connect to the optical waveguide. This holds true in the same way for the input surface of the conversion element.

The surface-emitting semiconductor chip or the plurality of surface-emitting semiconductor chips may comprise a chip substrate, on which the associated radiation-generating semiconductor layer sequence is arranged. The chip substrate may not be radiation-transmissive. Furthermore, the semiconductor chip or the plurality of semiconductor chips may furthermore comprise, for example, a front-side contact. In such a configuration, the optical waveguide may comprise, if appropriate, a shape coordinated therewith and comprising one or more cutouts via which one or more front-side contacts may be exposed.

A reflective material may be arranged at a front side of the optical waveguide in a region next to the conversion element. Depending on the geometric configuration of the optical waveguide, the reflective material may also be provided circumferentially with respect to the optical waveguide. In this way, no radiation may emerge at these locations, and achieving a high luminance may be promoted. For the reflective configuration, the optical waveguide may be provided with a reflective coating, for example. The reflective coating, which may also be provided on other constituent parts of the radiation-emitting component such as the semiconductor chip or the plurality of semiconductor chips, for example, may be realized as a monolayer or be multilayered and also in dielectric and/or metallic fashion in accordance with the examples described above.

The optical waveguide may comprise a rectangular cross-sectional shape. Alternatively, the optical waveguide comprises a shape tapering in the direction of the conversion element. In this way, the radiation generated by the radiation source may be guided to the conversion element with a high efficiency. The tapering optical waveguide may comprise in cross section, for example, a trapezoidal shape, and overall the shape of a truncated pyramid. In a further possible configuration, the optical waveguide comprises a front side extending in partly curved fashion.

The radiation-emitting component may comprise at least one heat dissipating element thermally coupled to the optical waveguide to dissipate heat from the optical waveguide. This example affords the possibility of a thermal energy arising as power loss during the radiation conversion being dissipated not only via the semiconductor chip or the plurality of semiconductor chips, but additionally via the at least one heat dissipating element. Operation of the radiation-emitting component with a high reliability and lifetime may be made possible as a result.

The at least one heat dissipating element may be configured from a metallic material. The optical waveguide may be arranged on the at least one heat dissipating element or on a bearing surface of the heat dissipating element. To avoid absorption of radiation, a reflective layer may be provided in this region. The reflective layer may comprise one or more mirror layers, for example, dielectric and/or metallic mirror layers. The at least one heat dissipating element may be arranged next to the semiconductor chip or the plurality of semiconductor chips.

A reflective material may be arranged circumferentially with respect to the conversion element. In this way, no radiation may emerge circumferentially with respect to the conversion element, and what may be achieved is that radiation is emitted only via a front-side radiation surface of the conversion element. In this configuration, by way of example, a reflective coating may be provided on the conversion element, and also on further constituent parts such as, for example, an optical waveguide or an optical waveguide device and/or at least one semiconductor chip. The reflective coating may be realized as a monolayer or as multilayered and also in dielectric and/or metallic fashion in accordance with the examples described above.

With regard to the above-described use of a reflective material on constituent parts of the radiation-emitting component such as the conversion element and the optical waveguide or the optical waveguide device, the following example may furthermore be considered. The radiation-emitting component may comprise a reflective plastics material, i.e., a plastics material comprising reflective particles embedded therein, which plastics material surrounds the arrangement comprising the radiation source, the optical waveguide device and the conversion element. In accordance with the configurations described above, one or a plurality of semiconductor chips may be surrounded by the reflective plastics material. A front-side radiation surface of the conversion element, via which radiation surface radiation may be emitted from the conversion element, is not covered with the plastics material. The reflective plastics material that may terminate flush with the radiation surface of the conversion element may be, for example, a silicone material comprising particles of $TiO_2$ contained therein.

The conversion element may be produced separately, and secured on the optical waveguide device or the optical waveguide via a radiation-transmissive connection material as indicated above. Such a configuration may be considered with regard to a ceramic conversion element or a conversion element comprising a matrix material with embedded conversion particles. A configuration in which the conversion element is realized in the form of a layer applied directly on the optical waveguide device or the optical waveguide is also possible. By way of example, the conversion element may be produced by spray coating. In this process, by way of example, a silicone material may be sprayed with particles comprising one or more conversion materials. Alternatively, applying particles comprising one or more conversion materials to configure the conversion element may be carried out by an electrophoretic deposition, for example.

The radiation-emitting component may furthermore comprise a carrier on which the abovementioned component parts of the component, for example, at least one semiconductor chip, a reflective plastics material, at least one heat dissipating element or the like, may be arranged. The carrier may be a ceramic carrier, for example. Furthermore, the carrier may comprise electrical contact structures to which the semiconductor chip or the plurality of semiconductor chips may be electrically connected.

The radiation-emitting component may be configured such that at least one scattering surface or structure is located in the radiation path. In this way, too, a transgression of the conservation of etendue may be achieved and providing a high luminance may thereby be promoted. Just the conversion element may bring about such scattering. With the use of a separately produced optical waveguide, an optical waveguide comprising a roughened surface may be employed. A further possible approach is the use of one or more semiconductor chips comprising a roughened surface. In sapphire flip-chips, the chip substrate comprising sapphire may comprise a structure at a side on which the at least one semiconductor layer sequence may be located (prestructured sapphire). Scattering may also be brought about with the aid of a plastics material comprising reflective particles.

The advantageous configurations and examples explained above may be employed individually or else in arbitrary combination with one another—apart from, for example, in unambiguous dependencies or incompatible alternatives.

The above-described properties and features and the way in which they are achieved will become clearer and more clearly understood in association with the following description of examples explained in greater detail in association with the schematic drawings.

Possible configurations of optoelectronic radiation-emitting components are described with reference to the following schematic figures. The components comprise a radiation source comprising one or more radiation-generating semiconductor layer sequences 120, 220 arranged next to one another, a conversion element 140, 240 for radiation conversion and an optical waveguide device 130, 230, 231, 232 located therebetween. The optical waveguide device 130, 230, 231, 232, which may also be referred to as an optical waveguide cavity, is optically connected to the radiation source and to the conversion element 140, 240. Side or surface regions of the optical waveguide device 130, 230, 231, 232 not used for optical coupling are configured in reflective fashion. Via an emission surface 125, 225, a light radiation may be emitted from the radiation source and be coupled into the optical waveguide device 130, 230, 231, 232. Via an input surface 141, 241, the light radiation coming from the optical waveguide device 130, 230, 231, 232 may be coupled into the conversion element 140, 240. The components are configured to the effect that the emission surface 125, 225 of the radiation source composed of the at least one semiconductor layer sequence 120, 220 is larger than the input surface 141, 241 of the conversion element 140, 240. An emission of light radiation from the conversion element 140, 240 with a high luminance may be achieved as a result. A high-current approach may be obviated in this construction.

The figures are merely schematic in nature and are not true to scale. In this sense, component parts and structures shown in the figures may be illustrated with exaggerated size or size reduction to afford a better understanding. In the same way, the radiation-emitting components may comprise further component parts and structures besides component parts shown and described.

FIG. 1 shows a lateral sectional illustration of a radiation-emitting component 101. A plan view illustration of constituent parts of the component 101 in accordance with a possible configuration of the component 101 is shown in FIG. 2. The component 101 comprises a carrier 170, on which a plurality of radiation-emitting semiconductor chips 110, i.e., two thereof in accordance with the configuration in FIG. 2, are arranged next to one another. The semiconductor chips 110 are LED chips (Light Emitting Diode) realized in the form of volume-emitting flip-chips. The semiconductor chips 110 each comprise a radiation-transmissive chip substrate 115 and, arranged thereon, a semiconductor layer sequence 120 that generates radiation. On account of the flip-chip construction, the semiconductor chips 110 are mounted on the carrier 170 such that the semiconductor layer sequences 120 are located in the region of a rear side facing the carrier 170, and the chip substrates 115 are located in the region of a front side of the semiconductor chips 110 facing away from the carrier 170. The semiconductor chips 110 comprise a rectangular plan view shape.

The chip substrates 115 of the semiconductor chips 110, which constitute an optical waveguide device 130 of the radiation-emitting component 101, may be configured from sapphire. In this configuration, the semiconductor chips 110 are so-called sapphire flip-chips. The semiconductor layer sequences 120 of the semiconductor chips 110 that may be produced by an epitaxy method each comprise an active zone (not illustrated) that generates a light radiation. During operation of a semiconductor chip 110, the light radiation generated in a semiconductor layer sequence 120 may be emitted via a radiation surface 121 of the semiconductor layer sequence 120, the radiation surface being indicated in a dashed manner in FIG. 1, and thereby coupled directly into the chip substrate 115 directly adjoining the semiconductor layer sequence 120.

As furthermore shown in FIG. 1, each semiconductor chip 110 comprises two rear-side contacts 117 on the semiconductor layer sequence 120, via which the semiconductor chips 110 may be supplied with electrical energy. Via the contacts 117, the semiconductor chips 110 electrically and mechanically connect to mating contacts of the carrier 170. A connection may be produced via an electrically conductive connection medium, for example, a solder or an electrically conductive adhesive (each not illustrated). The carrier 170 may be a ceramic carrier, for example. In addition to the mating contacts, the carrier 170 may comprise further electrical structures (not illustrated), for example, conductor tracks.

A further constituent part of the radiation-emitting component 101 is a laminar conversion element 140 for radiation conversion arranged on the optical waveguide device 130 comprising the chip substrates 115 (cf. FIG. 1). The conversion element 140 is configured to at least partly convert the primary light radiation generated by the semiconductor layer sequences 120 of the semiconductor chips 110 during operation of the component 101. The conversion element 140 may be a ceramic conversion element, for example. Furthermore, the conversion element 140 may be optically coupled to the optical waveguide device 130 comprising the chip substrates 115 via a radiation-transmissive connection material (not illustrated). By way of example, the conversion element 140 may be adhesively bonded onto the chip substrates 115 via a silicone material or soldered onto the chip substrates 115 via a glass solder.

The conversion element 140 comprises, as shown in FIG. 1, a rectangular cross-sectional shape and, as viewed from above, as shown in FIG. 2, a rectangular plan view shape.

The conversion element 140 comprises an input surface 141 facing the semiconductor chips 110 and a radiation surface 142 facing away from the semiconductor chips 110. The input surface 141 and the radiation surface 142 of the conversion element 140 are equal in size. The input surface 141 couples radiation into the conversion element 140, whereas the radiation surface 142 is used for radiation emission. The conversion element 140 is of such a size and is positioned on the two semiconductor chips 110 such that the conversion element 140 covers an interspace between the semiconductor chips 110, and the semiconductor chips 110 are partly covered by the conversion element 140 in equal parts (cf. FIG. 2).

As further illustrated in FIG. 1, the radiation-emitting component 101 furthermore comprises a radiation-transmissive material 150 in the interspace between the semiconductor chips 110. The radiation-transmissive material 150, which may be ascribed to the optical waveguide device 130, may be a silicone material, for example. The radiation-transmissive material 150 enables an optical connection and hence a crosstalk between the radiation-transmissive chip substrates 115 of the semiconductor chips 110.

A further component part of the radiation-emitting component 101 is a reflective plastics material 160 (shown only in FIG. 1), i.e., a plastics material 160 comprising reflective particles (not illustrated) embedded therein. The plastics material 160 is arranged on the carrier substrate 170 and surrounds the arrangement comprising the semiconductor chips 110 and the conversion element 140. The plastics material 160 comprises the same thickness as the arrangement comprising the semiconductor chips 110 and the conversion element 140, and terminates flush with the radiation surface 142 of the conversion element 140. In this way, the semiconductor chips 110 are covered with the plastics material 160 at sidewalls and at a front side in a region next to the conversion element 140. Sidewalls of the conversion element 140 are also surrounded by the plastics material 160. As a result, no radiation may emerge at these locations. The front-side radiation surface 142 of the conversion element 140 is not covered with the plastics material 160 such that the radiation surface 142 may be used for radiation emission.

The reflective plastics material 160 may be, for example, a silicone material and having particles of $TiO_2$ embedded therein. Furthermore, the plastics material 160 may be applied on the carrier 170 by potting, or carrying out a molding process.

During operation of the radiation-emitting component 101, the semiconductor layer sequences 120 of the semiconductor chips 110 serve as a radiation source that generates a primary light radiation. The radiation source comprises an emission surface 125 composed of the separate radiation surfaces 121 of the individual semiconductor layer sequences 120 (cf. FIG. 2). In the component 101, the chip substrates 115 of the semiconductor chips 110, the chip substrates being optically connected via the transparent material 150, serve as an optical waveguide device 130, into which the primary light radiation emitted via the emission surface 125 may be coupled. With the aid of the optical waveguide device 130, the radiation may be effectively guided further to the conversion element 140 and coupled into the conversion element 140 via the input surface 141 thereof. The primary light radiation coupled into the conversion element 140 may be at least partly converted into one or more secondary light radiations with the aid of the conversion element 140. Afterward, the radiation, which may comprise primary and secondary radiation portions, may be emitted from the radiation surface 142 of the conversion element 140. In accordance with the configuration shown in FIG. 2, the input surface 141 and the radiation surface 142 of the conversion element 140 comprise a rectangular plan view shape. The radiation surfaces 121 of the semiconductor layer sequences 120 also comprise, in accordance with the semiconductor chips 110, a rectangular plan view shape.

The primary light radiation generated by the semiconductor layer sequences 120 of the semiconductor chips 110 may be a blue light radiation, for example. Furthermore, it is possible for the blue primary radiation to be partly converted into a yellow secondary radiation with the aid of the conversion element 140. As a result of a superimposition of these light radiations, a white light radiation may be generated and emitted from the radiation surface 142 of the conversion element 140.

It becomes clear with reference to FIG. 2 that the emission surface 125 of the radiation source configured from the semiconductor layer sequences 120 is significantly larger than the input surface 141 of the conversion element 140. In this way, the primary light radiation may be concentrated on the conversion element 140. As a result, it is possible to achieve a radiation emission from the radiation surface 142 of the conversion element 140 with a high luminance.

A high luminance may be realized if the input surface 141 of the conversion element 140 and the emission surface 125 of the radiation source comprises a size ratio of at most 75%. A possible size ratio of input surface 141 to emission surface 125 in the region of 50% is illustrated in the plan view illustration in FIG. 2. In this case, the conversion element 140 comprises lateral dimensions corresponding to the lateral dimensions of a semiconductor chip 110.

A radiation emission with high luminance may be promoted, inter alia, by the radiation conversion taking place in the conversion element 140, which may involve absorption of primary radiation and reemission of secondary radiation in all possible spatial directions. Scattering effects occurring in the radiation path are furthermore expedient. Scattering may occur in the conversion element 140, for example. The reflective plastics material 160 may also bring about scattering. Furthermore, the chip substrates 115 of the semiconductor chips 110 may be configured in a structured fashion at the side on which the semiconductor layer sequences 120 are located (prestructured sapphire), which may likewise lead to scattering (not illustrated).

The construction of the radiation-emitting component 101 enables a radiation emission with high luminance without a high-current approach, that is to say without operation of semiconductor chips with a high current density of, for example, 3 $A/mm^2$. Instead it is possible to operate the semiconductor chips 110 of the component 101 with a current density of 1.5 $A/mm^2$, for example, and in this respect to design the semiconductor chips 110 only for such a mode of operation.

Possible variants and modifications that may be considered for a radiation-emitting component and the constituent parts thereof are described below. Corresponding features and advantages and also identical and identically acting component parts are not described in detail again below. Instead, reference is made to the above description for details in this respect. Furthermore, aspects and details mentioned with regard to one configuration of a component may also be employed with regard to another configuration and features of two or more configurations may be combined with one another.

A radiation-emitting component may be realized with a larger number of volume-emitting semiconductor chips. For exemplary illustration, the plan view illustration in FIG. 3 shows one possible configuration of the component 101 shown in cross section in FIG. 1 with four semiconductor chips 110 positioned on the carrier 170 next to one another in a rectangular arrangement. The conversion element 140 is positioned centrally with respect to the chip arrangement comprising the four semiconductor chips 110 such that the semiconductor chips 110 are partly covered by the conversion element 140 in equal parts. The radiation-transmissive material 150 is located between the semiconductor chips 110 in a corresponding manner (cf. FIG. 1) such that an optical connection is produced between the radiation-transmissive chip substrates 115 of the four semiconductor chips 110. Moreover, the arrangement comprising the four semiconductor chips 110 and the conversion element 140 is surrounded with the reflective plastics material such that only the radiation surface 142 of the conversion element 140 is not covered (cf. FIG. 1).

In the configuration of the radiation-emitting component 101 shown in FIG. 3, a size ratio between the input surface 141 of the conversion element 140 and the emission surface 125 of the radiation source in the region of 25% is present. In this case, the emission surface 125 is composed of the separate radiation surfaces 121 of the semiconductor layer sequences 120 of the four semiconductor chips 110.

FIG. 4 shows a lateral sectional illustration of a further radiation-emitting component 102. Instead of a plurality of semiconductor chips, the component 102 comprises a single LED chip 111 in the form of a volume-emitting flip-chip, the LED chip being arranged on a carrier substrate 170. The radiation-emitting semiconductor chip 111 comprises a radiation-transmissive chip substrate 115 comprising sapphire, for example, and a plurality of semiconductor layer sequences 120 arranged next to one another on the chip substrate 115. Such a semiconductor chip 111 may also be referred to as a multi-emitter flip-chip. The common chip substrate 115 for the plurality of semiconductor layer sequences 120 constitutes an optical waveguide device 130 of the component 102. The chip substrate 115 may be configured in a structured fashion (not illustrated) at the side on which the semiconductor layer sequences 110 are located.

The semiconductor chip 111 of the radiation-emitting component 102 is mounted on the carrier 170 such that the semiconductor layer sequences 120 are located in the region of a rear side facing the carrier 170, and the chip substrate 115 is located in the region of a front side of the semiconductor chip 111 facing away from the carrier 170. The plan view illustration in FIG. 5 shows one possible configuration of the component 102 and of the semiconductor chip 111, in which the semiconductor chip 111 comprises two semiconductor layer sequences 120. The semiconductor chip 111 and also the semiconductor layer sequences 120 thereof comprise a rectangular plan view shape.

During operation of the semiconductor chip 111, the light radiation generated in a semiconductor layer sequence 120 may be emitted via a radiation surface 121 of the semiconductor layer sequence 120 and thereby be coupled directly into the chip substrate 115 directly adjoining the semiconductor layer sequence 120. In FIG. 4, the various radiation surfaces 121 of the semiconductor layer sequences 120 are illustrated differently for the sake of better elucidation, i.e., with a dashed line and with a dotted line.

As furthermore shown in FIG. 4, the semiconductor chip 111 comprises two rear-side contacts 117 on each of the semiconductor layer sequences 120, via which contacts the semiconductor layer sequences 120 may be supplied with electrical energy. The semiconductor chip 111 electrically and mechanically connects to mating contacts of the carrier 170 via the contacts 117, wherein the connection is produced via an electrically conductive connection medium (not illustrated).

The further construction of the radiation-emitting component 102 corresponds to that of the component 101. In this regard, the component 102 comprises a laminar conversion element 140 for radiation conversion arranged on the chip substrate 115 serving as an optical waveguide device 130. The conversion element 140 may be optically coupled to the chip substrate 115 via a radiation-transmissive connection material (not illustrated). In the case of the configuration shown in FIG. 5, the conversion element 140 is of such a size and positioned on the semiconductor chip 111 such that the two semiconductor layer sequences 120 are partly covered by the conversion element 140 in equal parts.

A further constituent part of the radiation-emitting component 102 is a reflective plastics material 160, shown only in FIG. 4. The plastics material 160 is arranged on the carrier 170 and surrounds the arrangement comprising the semiconductor chip 111 and the conversion element 140 such that the semiconductor chip 111 at sidewalls and at a front side in a region next to the conversion element 140, and also the conversion element 140 at sidewalls are covered with the plastics material 160. A front-side radiation surface 142 of the conversion element 140 is not covered.

During operation of the radiation-emitting component 102, the semiconductor layer sequences 120 of the semiconductor chip 111 serve as a radiation source that generate a primary light radiation. The radiation source comprises an emission surface 125 composed of the separate radiation surfaces 121 of the individual semiconductor layer sequences 120 of the semiconductor chip 111 (cf. FIG. 5). The primary light radiation emitted via the emission surface 125 may be coupled into the chip substrate 115 of the semiconductor chip 111, the chip substrate serving as an optical waveguide device 130, and with the aid of the chip substrate 115 may be guided further to the conversion element 140 and coupled into the conversion element 140 via an input surface 141. With the aid of the conversion element 140, the primary light radiation may be at least partly converted into one or more secondary light radiations. Afterward, the radiation, which may comprise primary and secondary radiation portions, may be emitted from the radiation surface 142 of the conversion element 140. The primary light radiation may be a blue light radiation partly converted into a yellow secondary radiation with the aid of the conversion element 140 such that a white light radiation may be emitted from the conversion element 140.

In the radiation-emitting component 102, the emission surface 125 of the radiation source constituted from the semiconductor layer sequences 120 is likewise significantly larger than the input surface 141 of the conversion element 140 such that radiation may be emitted with a high luminance from the radiation surface 142 of the conversion element 140. As a result, it is possible to operate the semiconductor chip 111 or the semiconductor layer sequences 120 thereof with a current density of 1.5 A/mm$^2$, for example, rather than under high-current conditions. The plan view illustration in FIG. 5 shows one possible size ratio of input surface 141 to emission surface 125 in the region of 50%. In this case, the conversion element 140 comprises lateral dimensions corresponding to the lateral dimensions of a semiconductor layer sequence 120.

Figure 6:
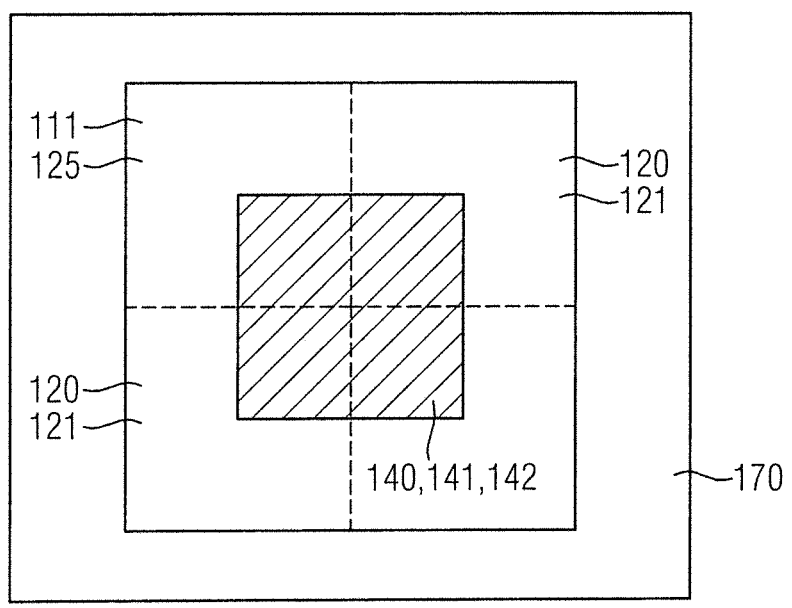

The semiconductor chip 111 of the radiation-emitting component 102 may be configured with a larger number of semiconductor layer sequences 120. FIG. 6 shows a further possible configuration of the component 102 in a plan view illustration, wherein the semiconductor chip 111 comprises four semiconductor layer sequences 120 arranged next to one another in rectangular fashion. The conversion element 140 is arranged centrally on the semiconductor chip 111 such that the four semiconductor layer sequences 120 are partly covered by the conversion element 140 in equal parts. In accordance with FIG. 6, a size ratio between the input surface 141 of the conversion element 140 and the emission surface 125 of the radiation source composed of the four semiconductor layer sequences 120 in the region of 25% is present.

Figure 7:
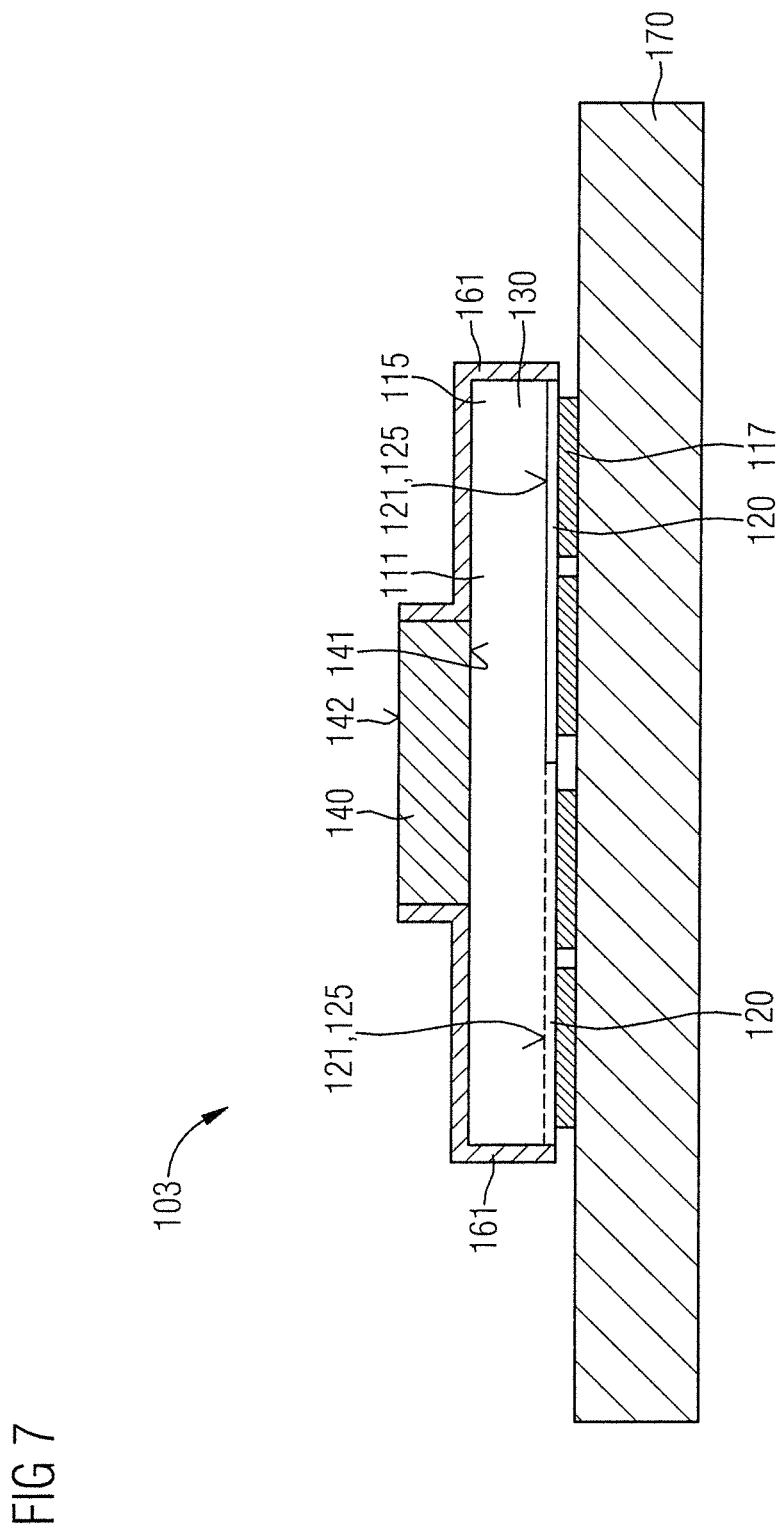
FIG. 7 shows a lateral illustration of a further radiation-emitting component including a volume-emitting multi-emitter flip-chip, a conversion element and a reflective coating.

A radiation-emitting component may be configured not just with a reflective plastics material. For exemplary illustration, FIG. 7 shows a lateral sectional illustration of a further radiation-emitting component 103. The component 103 comprises a construction comparable to that of the component 102 with a multi-emitter flip-chip 111 arranged on a carrier 170, and a conversion element 140 arranged thereon. Instead of a plastics material 160, the component 103 comprises a reflective coating 161 that covers the semiconductor chip 111 at sidewalls and at a front side in a region next to the conversion element 140, and also the conversion element 140 at sidewalls. In this way, no radiation may emerge at these locations. A radiation surface 142 of the conversion element 140 is not covered, and it is available for radiation emission.

The reflective coating 161 may be configured as a monolayer and be, for example, a dielectric or a metallic mirror layer. A multilayered configuration (not illustrated) is also possible, in which the coating 161 may comprise a plurality of dielectric and/or metallic mirror layers arranged one on top of another.

For the radiation-emitting component 101 from FIG. 1, a modified configuration (not illustrated) with a reflective coating 161 instead of the plastics material 160 may be considered in a corresponding manner. In this case, the semiconductor chips 110 are covered with the reflective coating 161 at sidewalls and at a front side in a region next to the conversion element 140, and the conversion element 140 is also covered with the reflective coating at sidewalls.

Radiation-emitting components may be realized not only with volume-emitting flip-chips, but also with surface-emitting semiconductor chips. Possible configurations are explained in greater detail with reference to the following figures.

Figure 8:
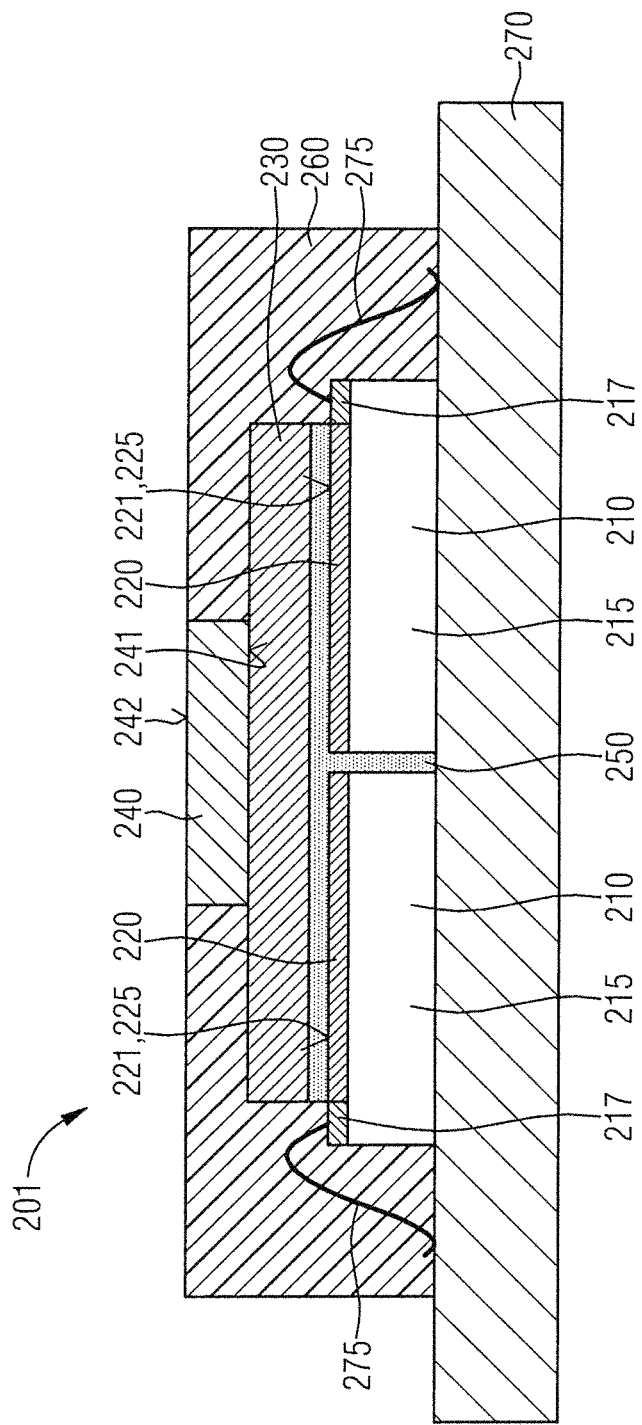
FIG. 8 shows a lateral illustration of a further radiation-emitting component including surface-emitting semiconductor chips, an optical waveguide, a conversion element and a reflective plastics material.
Figure 9:
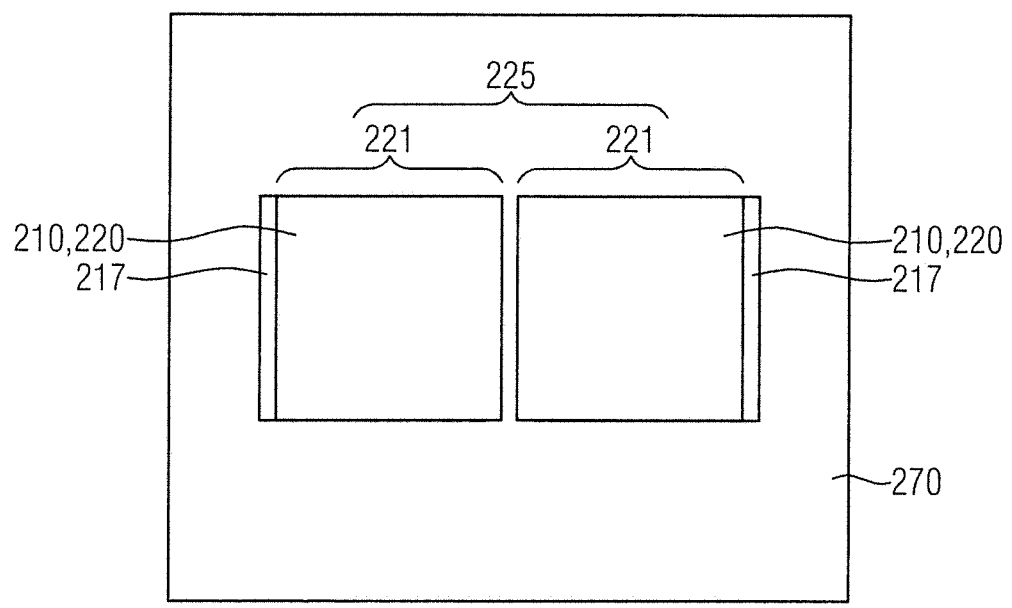
FIGS. 9 to 11 show plan view illustrations of constituent parts of the component from FIG. 8.
Figure 10:
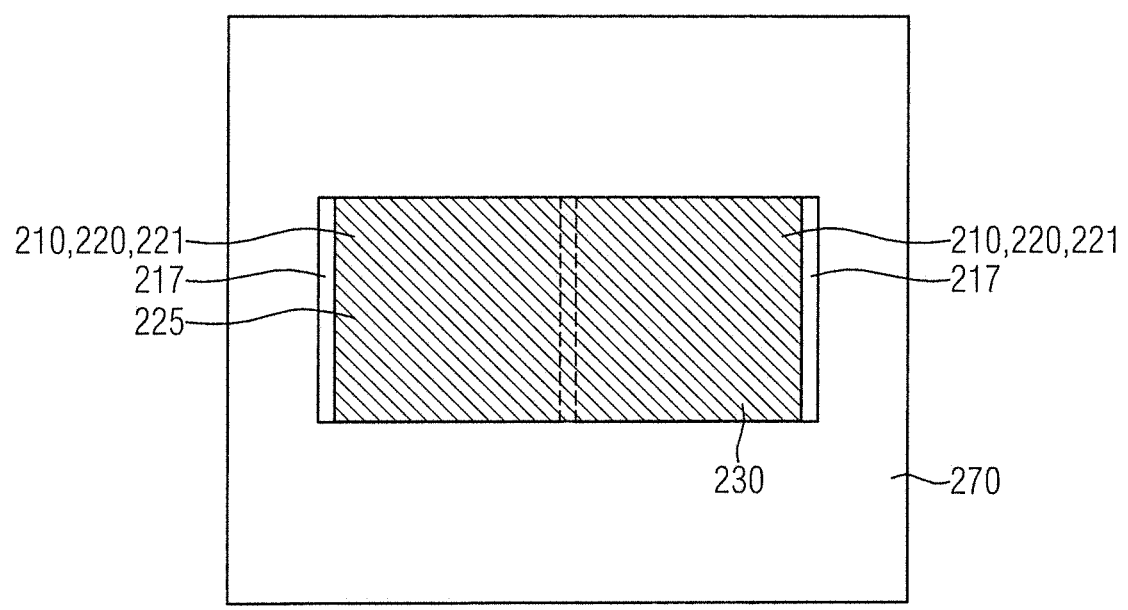
Figure 11:
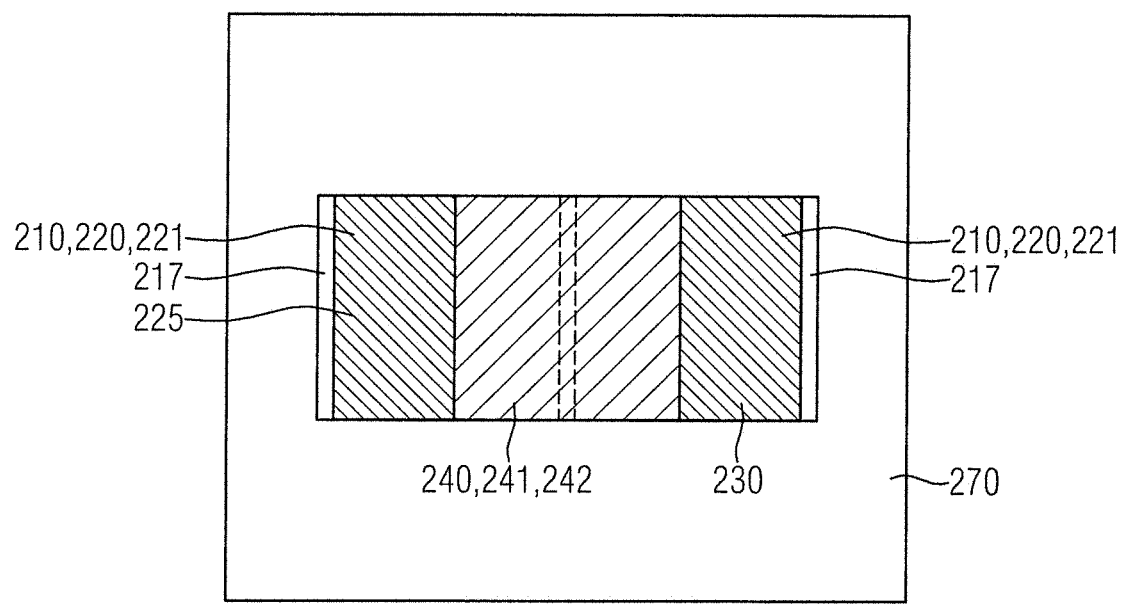

FIG. 8 shows a lateral sectional illustration of a further radiation-emitting component 201. For further illustration, FIGS. 9 to 11 show plan view illustrations of constituent parts of the component 201 in accordance with a possible configuration. The component 201 comprises a carrier 270, on which a plurality of radiation-emitting semiconductor chips 210, i.e., two thereof as shown in FIG. 9, are arranged next to one another. The semiconductor chips 210 are surface-emitting LED chips. Each semiconductor chip 210 comprises a chip substrate 215 and, arranged thereon, is a semiconductor layer sequence 220 that generates radiation. The semiconductor chips 210 are mounted on the carrier 270 such that the semiconductor layer sequences 220 are located in the region of a front side facing away from the carrier 270, and the chip substrates 215 are located in the region of a rear side of the semiconductor chips 210 facing the carrier 270. The semiconductor chips 210 comprise a rectangular plan view shape. In the configuration shown in FIG. 9, this also applies to the semiconductor layer sequences 220.

The chip substrates 215 of the semiconductor chips 210 are not radiation-transmissive. Moreover, the chip substrates 215 may be configured in electrically conductive fashion. The semiconductor layer sequences 220 arranged thereon, which may be produced by an epitaxy method, each comprise an active zone (not illustrated) that generates a light radiation. During operation of a semiconductor chip 210, the light radiation generated in a semiconductor layer sequence 220 may be emitted via a front-side radiation surface 221. The radiation surfaces 221 comprise a rectangular plan view shape in a manner corresponding to the semiconductor layer sequences 220. As in the configurations described above, the semiconductor layer sequences 220 together constitute a radiation source comprising an emission surface 225 composed of separate radiation surfaces 221 of the individual semiconductor layer sequences 220 (cf. FIG. 9).

In the case of the configuration shown in FIG. 8, each surface-emitting semiconductor chip 210 furthermore comprises a front-side contact 217 and a rear-side contact (not illustrated), via which the semiconductor chips 210 may be supplied with electrical energy. In a semiconductor chip 210, the front-side contact 217 is arranged laterally next to the radiation-generating semiconductor layer sequence 220 on the chip substrate 215. In this design, the semiconductor chips 210 may be, for example, UX:3 chips (product designation from Osram Opto Semiconductors). The front-side contacts 217 of the semiconductor chips 210 are electrically connected to mating contacts (not illustrated) of the carrier substrate 270 via bond wires 275 (shown only in FIG. 8).

The plan view illustration in FIG. 9 illustrates a strip-shaped example of the contacts 217, which may also be referred to as bar contacts in this configuration. In this case, the semiconductor chips 210 are furthermore positioned with respect to one another such that the contacts 217 are located at opposite sides of the chip arrangement comprising the two semiconductor chips 210.

The rear-side contacts (not illustrated) of the semiconductor chips 210 are arranged in the region of the rear side on the chip substrates 215 of the semiconductor chips 210. Via the rear-side contacts, the semiconductor chips 210 are electrically and mechanically connected to further mating contacts of the carrier 270. A connection may be produced via an electrically conductive connection medium such as, for example, a solder or an electrically conductive adhesive (not illustrated in each case). The carrier 270 may be a ceramic carrier, for example, which may comprise, in addition to the mating contacts, further electrical structures (not illustrated) such as conductor tracks, for example.

Instead of an optical waveguide device comprising one or more chip substrates such as is present in the case of the above-described components comprising volume-emitting flip-chips, the radiation-emitting component 201 shown in FIG. 8 comprises an optical waveguide 230 produced separately from the semiconductor chips 210. The optical waveguide 230 is configured from a radiation-transmissive material, for example, from sapphire or a glass material. The optical waveguide 230, which is realized as a laminar surface optical waveguide, comprises a rectangular cross-sectional shape.

The optical waveguide 230 is arranged on the semiconductor chips 210. In this case, the optical waveguide 230 connects optically to the radiation-generating semiconductor layer sequences 220 of the semiconductor chips 210 and thus optically to the radiation surfaces 221 via a radiation-transmissive material 250. In this way, the light radiation generated in a semiconductor layer sequence 220 of a semiconductor chip 210 may be emitted via the radiation surface 221 thereof and be coupled into the optical waveguide 230. As is shown in FIG. 8, the radiation-transmissive material 250 may be arranged not only between the optical waveguide 230 and the semiconductor chips 210, but also between the semiconductor chips 210 themselves. The radiation-transmissive material 250 may be a silicone material, for example.

The plan view illustration in FIG. 10 shows a configuration of the optical waveguide 230 comprising a rectangular plan view shape. The optical waveguide 230 is of such a size and positioned on the two semiconductor chips 210 such that the optical waveguide 230 completely covers the radiation surfaces 221 of the semiconductor layer sequences 220, and thus the emission surface 225 composed of the radiation surfaces 221.

The radiation-emitting component 201 furthermore comprises a laminar conversion element 240 for radiation conversion arranged on the optical waveguide 230 (cf. FIG. 8). With the aid of the conversion element 240, the primary light radiation generated by the semiconductor layer sequences 220 of the semiconductor chips 210 during operation of the component 201 may be at least partly converted. The conversion element 240 may be a ceramic conversion element, for example. Furthermore, the conversion element 240 may be connected and thereby optically coupled to the optical waveguide 230 via a radiation-transmissive connection material (not illustrated), for example, a silicone material or a glass solder.

The conversion element 240 comprises a rectangular cross-sectional shape and, as shown in the plan view illustration in FIG. 11, a rectangular plan view shape. The conversion element 240 comprises an input surface 241 for coupling in radiation, the input surface facing the optical waveguide 230, and a radiation surface 242 for radiation emission facing away from the optical waveguide 230. The input surface 241 and the radiation surface 242 are equal in size, and rectangular as viewed from above. The conversion element 240 is of such a size and arranged on the optical waveguide 230 such that the conversion element 240 covers an interspace between the semiconductor chips 210 and the semiconductor chips 210 are partly covered by the conversion element 240 in equal parts (cf. FIG. 11).

A further component part of the radiation-emitting component 201 is a plastics material 260 (shown only in FIG. 8) comprising reflective particles (not illustrated) embedded therein. The reflective plastics material 260 is arranged on the carrier 270 and comprises the same thickness as the arrangement comprising the semiconductor chips 210, the optical waveguide 230 and the conversion element 240. The plastics material 260 terminates flush with the radiation surface 242 of the conversion element 240. The arrangement 210, 230, 240 in this way is surrounded by the plastics material 260 such that the semiconductor chips 210 at sidewalls and in the region of the front-side contacts 217, the optical waveguide 230 at sidewalls and at a front side in a region next to the conversion element 240, and the conversion element 240 at sidewalls are covered with the plastics material 260. As a result, no radiation may emerge at these locations of the optical waveguide 230 and the conversion element 240. The front-side radiation surface 242 of the conversion element 240 is not covered.

In accordance with the configurations described above, the plastics material 260 may be, for example, a silicone material comprising particles of $TiO_2$ embedded therein. Moreover, the plastics material 260 may be applied on the carrier substrate 270, for example, by potting or carrying out a molding process.

During operation of the radiation-emitting component 201, the semiconductor layer sequences 220 of the semiconductor chips 210 serve as a radiation source that generates a primary light radiation. The primary light radiation may be emitted via the emission surface 225 composed of the radiation surfaces 221 (cf. FIG. 9) and coupled into the optical waveguide 230. With the aid of the optical waveguide 230, the radiation may be effectively guided further to the conversion element 240 and be coupled into the conversion element 240 via the input surface 241 thereof. With the aid of the conversion element 240, the primary light radiation may be at least partly converted into one or more secondary light radiations. Afterward, the radiation, which may comprise primary and secondary radiation portions, may be emitted from the radiation surface 242 of the conversion element 240. The primary light radiation may be a blue light radiation, which is partly converted into a yellow secondary radiation with the aid of the conversion element 240 such that a white light radiation may be emitted from the conversion element 240.

In the radiation-emitting component 201, the emission surface 225 of the radiation source constituted from the semiconductor layer sequences 220 is likewise significantly larger than the input surface 241 of the conversion element 240 such that radiation with a high luminance may be emitted from the radiation surface 242 of the conversion element 240. A high-current approach may therefore be obviated. The semiconductor chips 210 may be operated, for example, with a current density of 1.5 $A/mm^2$, for example, and designed merely for such a mode of operation. FIGS. 9 and 11 show one possible size ratio of input surface 241 to emission surface 225 in the region of 50%. In this case, the conversion element 240 comprises lateral dimensions corresponding to the lateral dimensions of a semiconductor layer sequence 220.

In the radiation-emitting component 201, too, achieving the high luminance may be promoted by the mechanism of radiation conversion and by scattering effects (for example, brought about in the conversion element 240 and also by the plastics material 260). With regard to bringing about scattering, consideration may additionally be given to using an optical waveguide 230 comprising a roughened surface. It is furthermore possible to use semiconductor chips 210 comprising a roughened surface in the region of the radiation surface 221 (each not illustrated).

Figure 12:
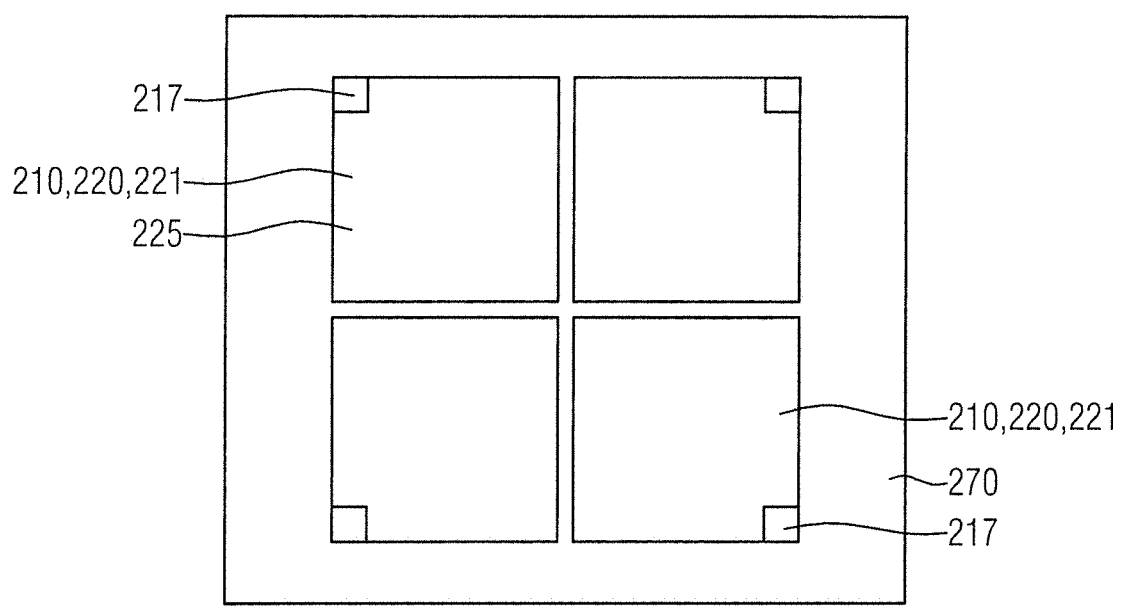
FIGS. 12 to 14 show plan view illustrations of constituent parts of the component from FIG. 8 in accordance with an alternative configuration.
Figure 13:
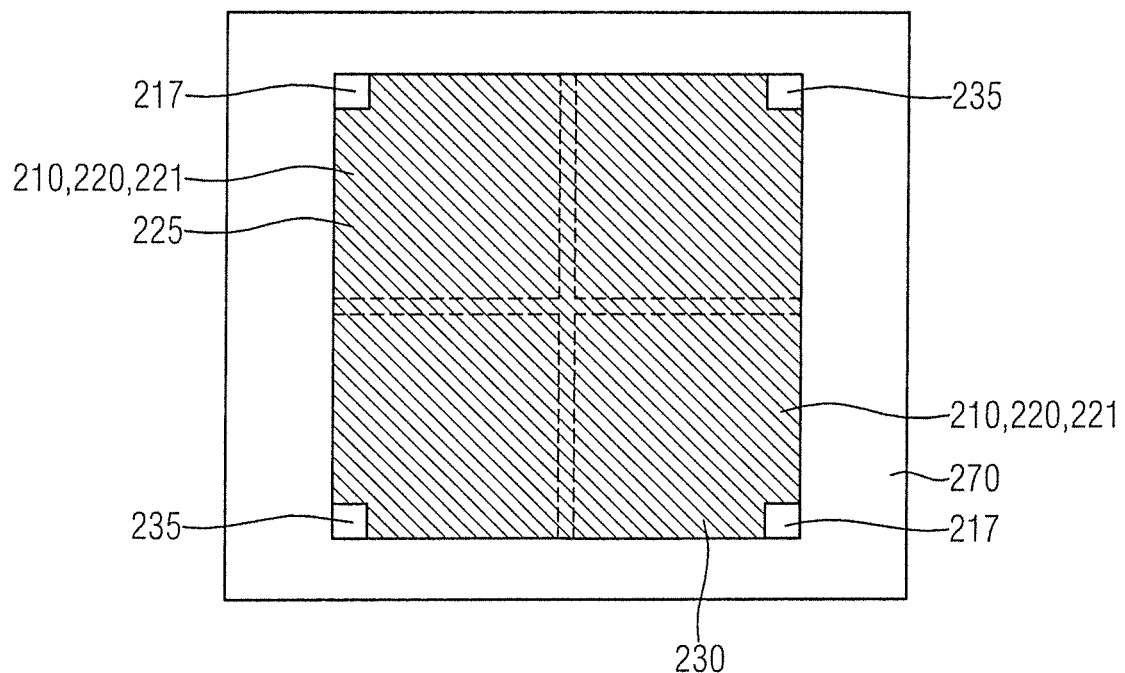
Figure 14:
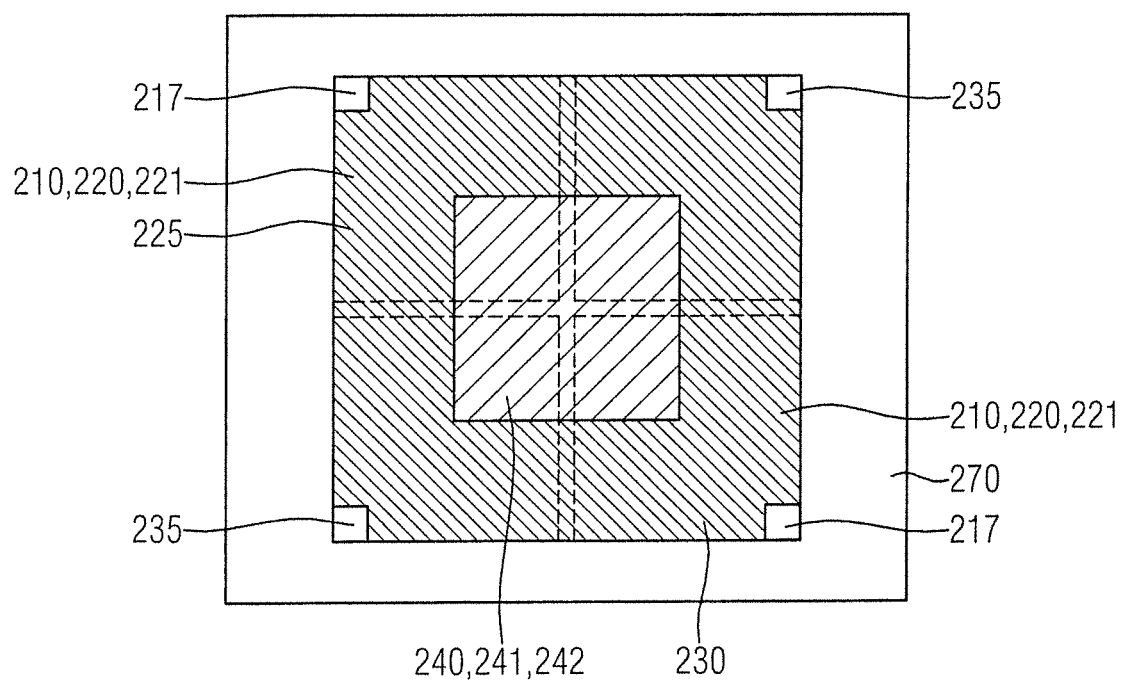

A radiation-emitting component may be realized with a larger number of surface-emitting semiconductor chips. The plan view illustrations in FIGS. 12 to 14 show constituent parts of one possible configuration of the component 201 illustrated in cross section in FIG. 8 with four semiconductor chips 210 positioned on the carrier 270 next to one another in a rectangular arrangement. In the configuration shown, the semiconductor chips 210 furthermore comprise a construction deviating from FIGS. 9 to 11. In this case, the front-side contact 217 of the semiconductor chips 210 is not configured in strip-shaped fashion, but rather located in each case in a corner region of the relevant semiconductor chip 210. On account of this example, the semiconductor layer sequences 220 and thus the radiation surface 221 of the semiconductor chips 210, which are rectangular in plan view, each comprise a plan view shape deviating from a rectangle with a cutout for the associated contact 217. The semiconductor chips 210 are positioned with respect to one another such that the contacts 217 are located at the corners of the chip arrangement comprising the four semiconductor chips 210 (cf. FIG. 12).

The optical waveguide 230 arranged on the semiconductor chips 210 comprises, as shown in FIG. 13, a plan view shape coordinated therewith and deviating from a rectangle with cutouts 235 at the corners for exposing the front-side contacts 217 of the semiconductor chips 210. In this configuration, too, the optical waveguide 230 is of such a size and positioned on the semiconductor chips 210 such that the radiation surfaces 221 of the semiconductor layer sequences 220, and thus the emission surface 225 composed of the four radiation surfaces 221 are completely covered by the optical waveguide 230.

The conversion element 240, as shown in FIG. 14, is arranged centrally with respect to the optical waveguide 230 and the four semiconductor chips 210 such that the semiconductor chips 210 are partly covered by the conversion element 240 in equal parts. In the configuration shown here, a size ratio between the input surface 241 of the conversion element 240 and the emission surface 225 of the radiation source composed of the four semiconductor layer sequences 220 in the region of 25% is present.

Figure 15:
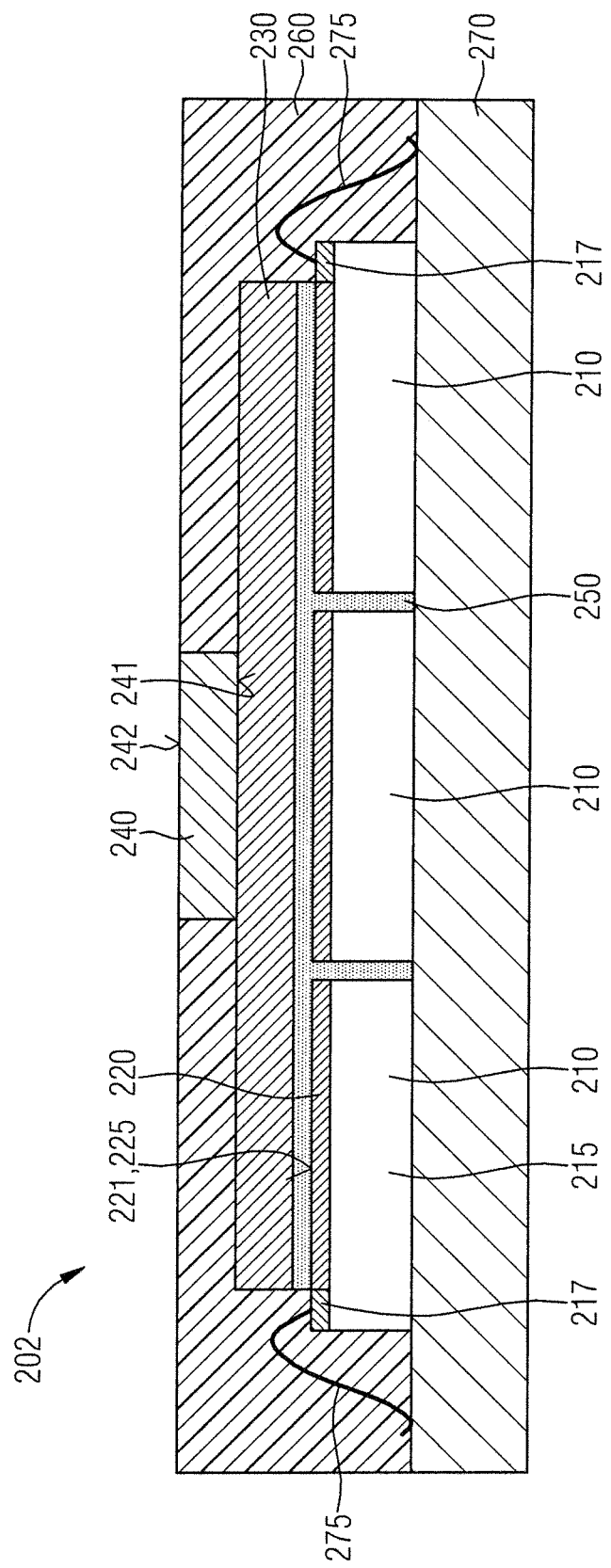
FIG. 15 shows a lateral illustration of a further radiation-emitting component including surface-emitting semiconductor chips, an optical waveguide, a conversion element and a reflective plastics material.

FIG. 15 shows a lateral sectional illustration of a further radiation-emitting component 202. The component 202 comprises a construction comparable to that of the component 201 with, in cross section, three instead of two semiconductor chips 210. The plan view illustrations in FIGS. 16, 17 show constituent parts in accordance with a possible configuration of the component 202. In this case, the component 202 comprises a total of six semiconductor chips 210 arranged next to one another in two rows each comprising three semiconductor chips 210. The configuration of the semiconductor chips 210 comprising rectangular semiconductor layer sequences 220 and radiation surfaces 221, and comprising strip-shaped front-side contacts 217 is furthermore used. The semiconductor chips 210 are positioned with respect to one another such that the contacts 217 are located at the sides of the chip arrangement (cf. FIG. 16).

An optical waveguide 230 arranged on the semiconductor chips 210 and optically coupled to the semiconductor chips 210 via a radiation-transmissive material 250 comprises, as is shown in FIG. 17, a rectangular plan view shape. The optical waveguide 230 is of such a size and positioned on the semiconductor chips 210 such that radiation surfaces 221 of the semiconductor layer sequences 220, and thus an emission surface 225 composed of radiation surfaces 221, are completely covered by the optical waveguide 230. A conversion element 240 arranged on the optical waveguide 230 is positioned centrally with respect to the optical waveguide 230 and the chip arrangement. In the configuration shown, only two of the semiconductor chips 210 are partly covered by the conversion element 240. The conversion element 240 comprises relatively small lateral dimensions such that a correspondingly small size ratio between an input surface 241 of the conversion element 240 and the emission surface 225 is also present.

In the radiation-emitting components 201, 202 shown in cross section in FIGS. 8 and 15, the optical waveguide 230 comprises a rectangular cross-sectional shape. It is also possible to use optical waveguides comprising other shapes, as explained in greater detail below.

Figure 18:
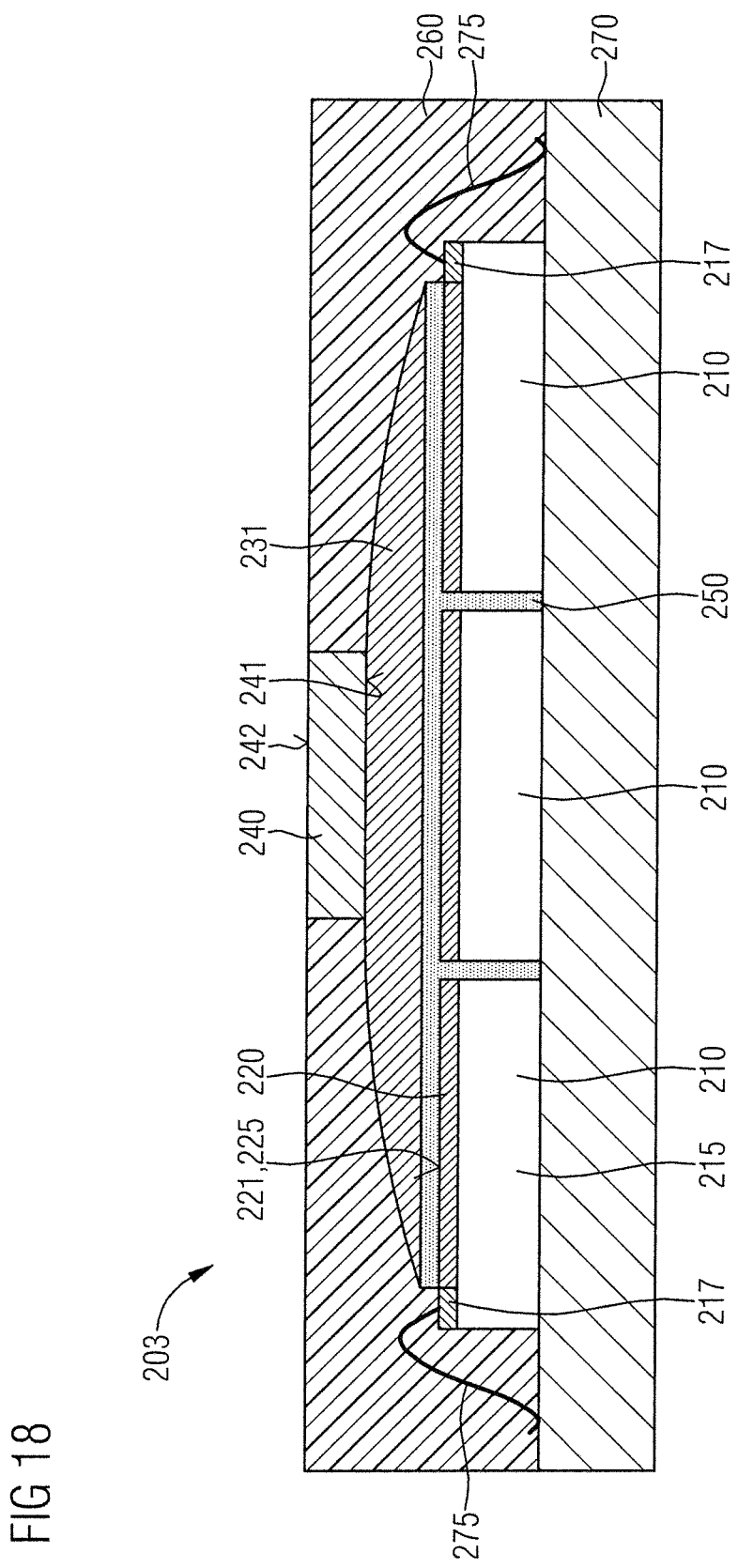
FIGS. 18 and 19 show lateral illustrations of further radiation-emitting components including optical waveguides including a cross-sectional shape tapering in the direction of the conversion element.

FIG. 18 shows a lateral sectional illustration of a further radiation-emitting component 203 constituting a modification of the component 202. Instead of an optical waveguide 230 comprising a rectangular cross-sectional shape, the component 203 comprises an optical waveguide 231 comprising a cross-sectional shape tapering in the direction of a conversion element 240. In this case, a front side of the optical waveguide 231 is configured in a manner extending in a partly curved fashion, i.e., in a manner extending in a parabolically or elliptically curved fashion. This shape may be correspondingly present in a perpendicular cross-sectional direction with respect to FIG. 18.

Figure 19:
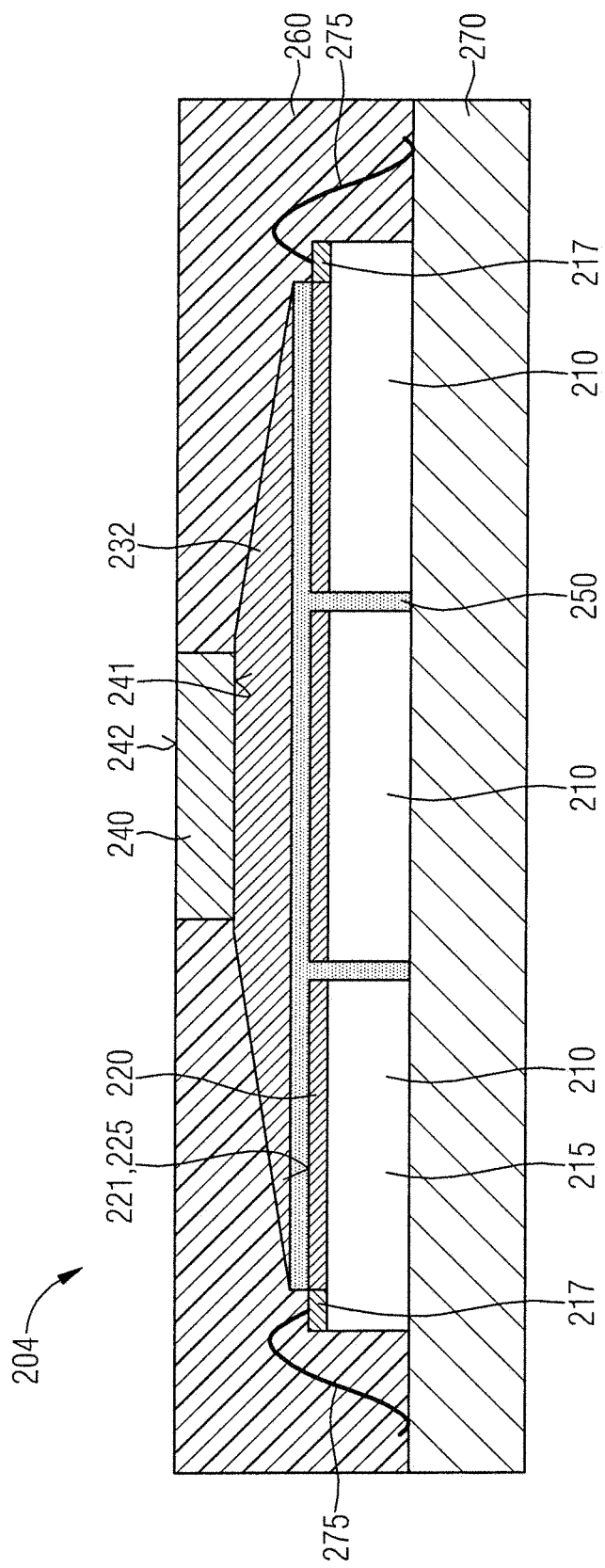

FIG. 19 shows a lateral sectional illustration of a further radiation-emitting component 204, which likewise constitutes a modification of the component 202. The component 204, too, comprises an optical waveguide 232 comprising a cross-sectional shape tapering in the direction of a conversion element 240. In this case, the optical waveguide 232 comprises a front side extending partly in an angular fashion, and hence a trapezoidal shape in cross section. This configuration may be correspondingly present in a perpendicular cross-sectional direction with respect to FIG. 19. Therefore, the optical waveguide 232 may comprise overall the shape of a truncated pyramid.

The shape tapering in the direction of the conversion element 240 in the optical waveguides 231, 232 makes it possible for the radiation generated by the radiation source, i.e., by the semiconductor layer sequences 220 of the plurality of semiconductor chips 210, and is coupled into the optical waveguide 231, 232 to be guided with a high efficiency to the conversion element 240 and thereby to be coupled into the conversion element 240. The radiation-emitting components 203, 204 may comprise a construction corresponding to FIG. 17 as viewed from above.

Figure 20:
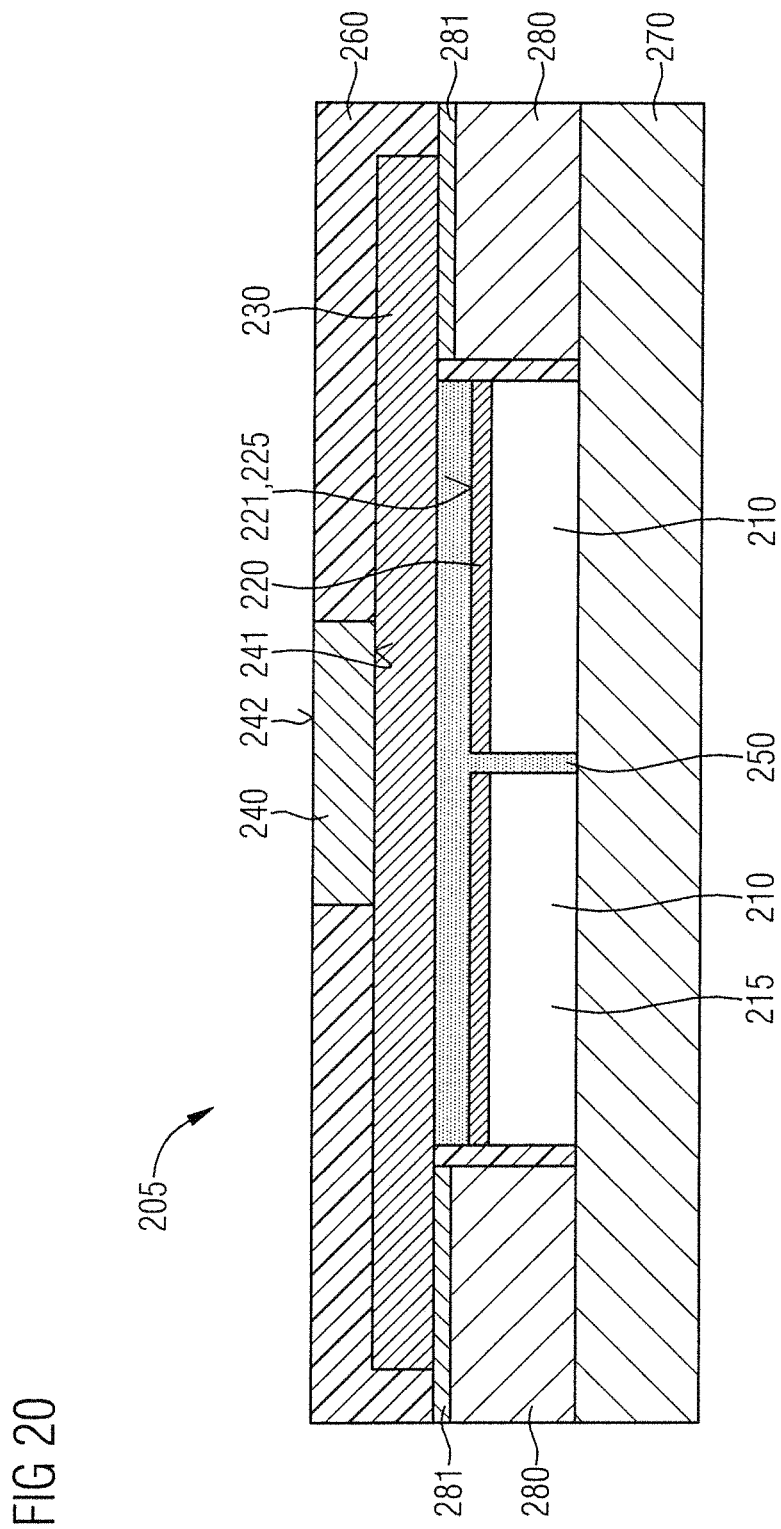
FIG. 20 shows a lateral illustration of a further radiation-emitting component including heat dissipating elements.
Figure 21:
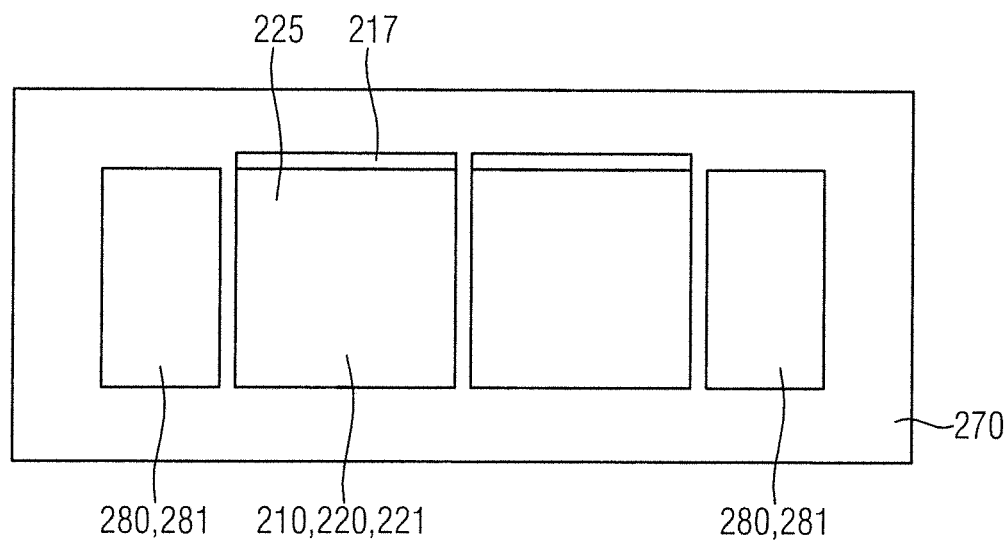
FIGS. 21 and 22 show plan view illustrations of constituent parts of the component from FIG. 20.

For radiation-emitting components comprising an optical waveguide, a construction comprising at least one heat dissipating element which is thermally coupled to the optical waveguide may be considered to provide improved heat dissipation. For exemplary illustration, FIG. 20 shows a lateral sectional illustration of a further radiation-emitting component 205 configured with this aim. Constituent parts in accordance with a possible configuration of the component 205 are shown in the plan view illustrations in FIGS. 21 and 22. The component 205 comprises two semiconductor chips 210 arranged next to one another on a carrier 270, the semiconductor chips in this example being configured with rectangular semiconductor layer sequences 220 and radiation surfaces 221 and with strip-shaped front-side contacts 217. The semiconductor chips 210 are positioned with respect to one another such that the contacts 217 are located at a side of the chip arrangement.

The radiation-emitting component 205 furthermore comprises two heat dissipating elements 280, which are likewise arranged on the carrier 270. The heat dissipating elements 280 are located at opposite sides next to the chip arrangement comprising the two semiconductor chips 210 (cf. FIGS. 20 and 21). The heat dissipating elements 280 may be configured from a metallic material, for example.

Figure 22:
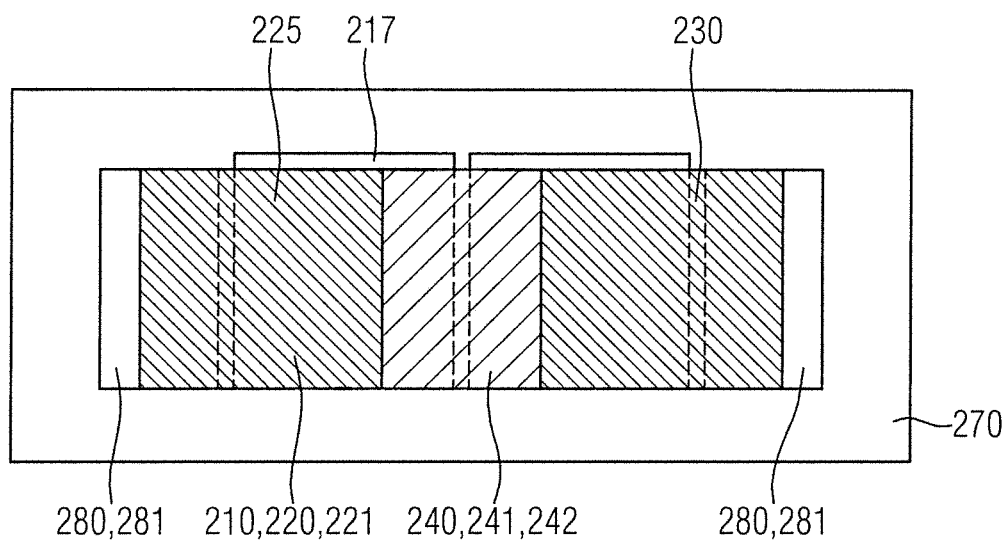

The radiation-emitting component 205 further comprises an optical waveguide 230 comprising a rectangular plan view shape, the optical waveguide being arranged on the semiconductor chips 210 and on the heat dissipating elements 280 (cf. FIGS. 20 and 22). Radiation surfaces 221 of the semiconductor layer sequences 220 and an emission surface 225 composed of the radiation surfaces 221 are completely covered by the optical waveguide 230. The optical waveguide 230 optically connects to the semiconductor layer sequences 220 of the semiconductor chips 210 via a radiation-transmissive material 250.

To avoid absorption of light radiation at the heat dissipating elements 280, as illustrated in FIG. 20, a respective reflective layer 281 is provided between the optical waveguide 230 and the heat dissipating elements 280. As indicated in FIG. 20, the reflective layer 281 may be realized in the form of a coating of the heat dissipating elements 280, the optical waveguide 230 being placed on the coating. The reflective layer 281 may be configured as a monolayer comprising, for example, a dielectric or metallic material. A multilayered configuration (not illustrated) comprising a plurality of dielectric and/or metallic sublayers arranged one on top of another is also possible.

Further constituent parts of the radiation-emitting component 205 are once again a conversion element 240 arranged centrally on the optical waveguide 230, and also a reflective plastics material 260 surrounding the arrangement comprising the semiconductor chips 210, the heat dissipating elements 260, the optical waveguide 230 and the conversion element 240. A front-side radiation surface 242 of the conversion element 240 is not covered.

In the radiation-emitting component 205, the optical waveguide 230 thermally connects to the heat dissipating elements 280. As a result, it is possible for a thermal energy generated during operation of the component 205 owing to the radiation conversion in the conversion element 240 and introduced into the optical waveguide 230 to be dissipated not only via the semiconductor chips 210 but additionally via the heat dissipating elements 280 and to be fed to the carrier 270. In this way, the component 205 may be distinguished by a reliable mode of operation with a long lifetime.

Figure 23:
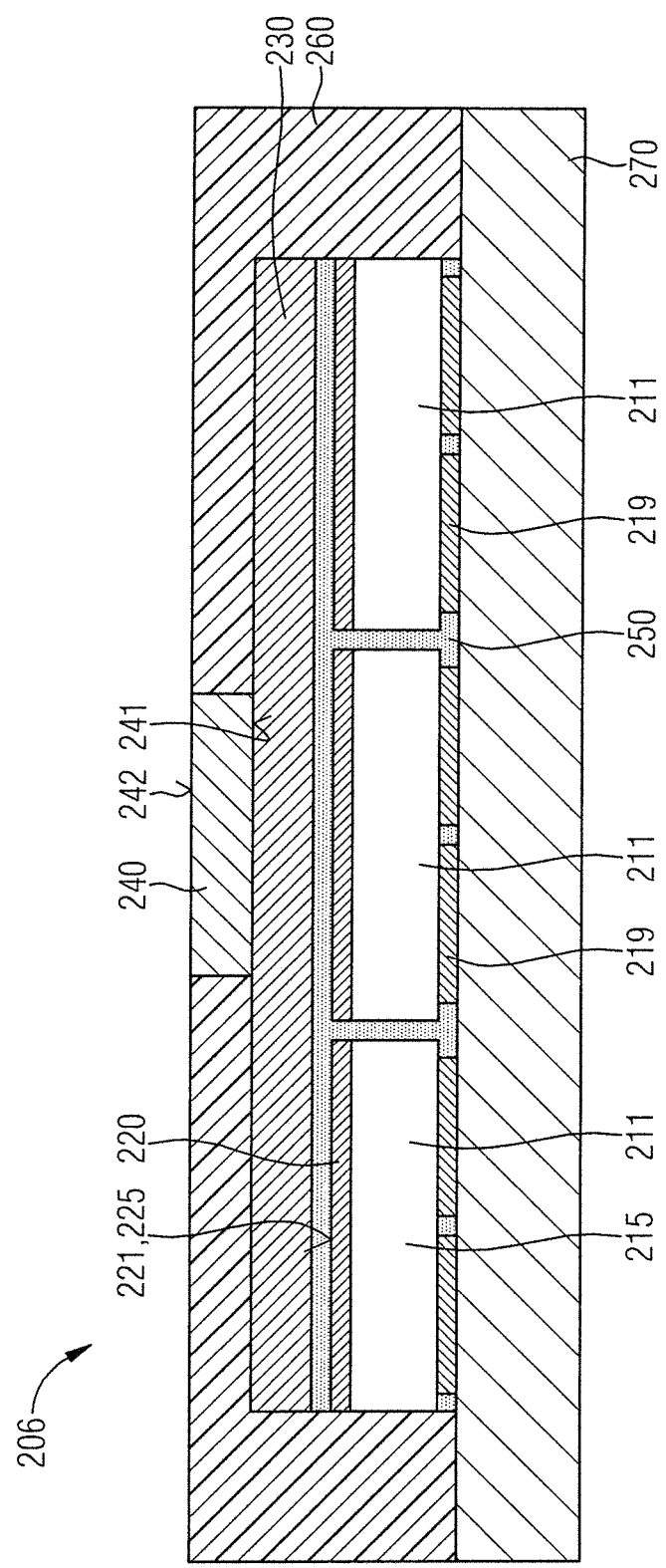
FIG. 23 shows a lateral illustration of a further radiation-emitting component including surface-emitting semiconductor chip including only rear-side contacts.

Radiation-emitting components may be realized with surface-emitting semiconductor chips which do not comprise front-side contacts. For exemplary illustration, FIG. 23 shows a lateral sectional illustration of a radiation-emitting component 206 configured with this aim. The component 206, shown in a plan view illustration in FIG. 24, comprises a construction comparable to that of the component 202 comprising six surface-emitting semiconductor chips 211 arranged on a carrier 270. Like the semiconductor chips 210, the semiconductor chips 211 each comprise a non-radiation-transmissive chip substrate 215 and, arranged thereon, a semiconductor layer sequence 220 for generating radiation. The radiation generated in a semiconductor layer sequence 220 may be emitted via a radiation surface 221. The semiconductor chips 211 and also their semiconductor layer sequences 220 and radiation surfaces 221 comprise a rectangular plan view shape (cf. FIG. 24).

As shown in FIG. 23, each semiconductor chip 211 furthermore comprises two rear-side contacts 219, via which the semiconductor chips 211 may be supplied with electrical energy. Via the contacts 219, the semiconductor chips 211 electrically and mechanically connect to mating contacts of the carrier 270, wherein a connection may be produced via an electrically conductive connection medium such as, for example, a solder or an electrically conductive adhesive (not illustrated in each case).

Figure 24:
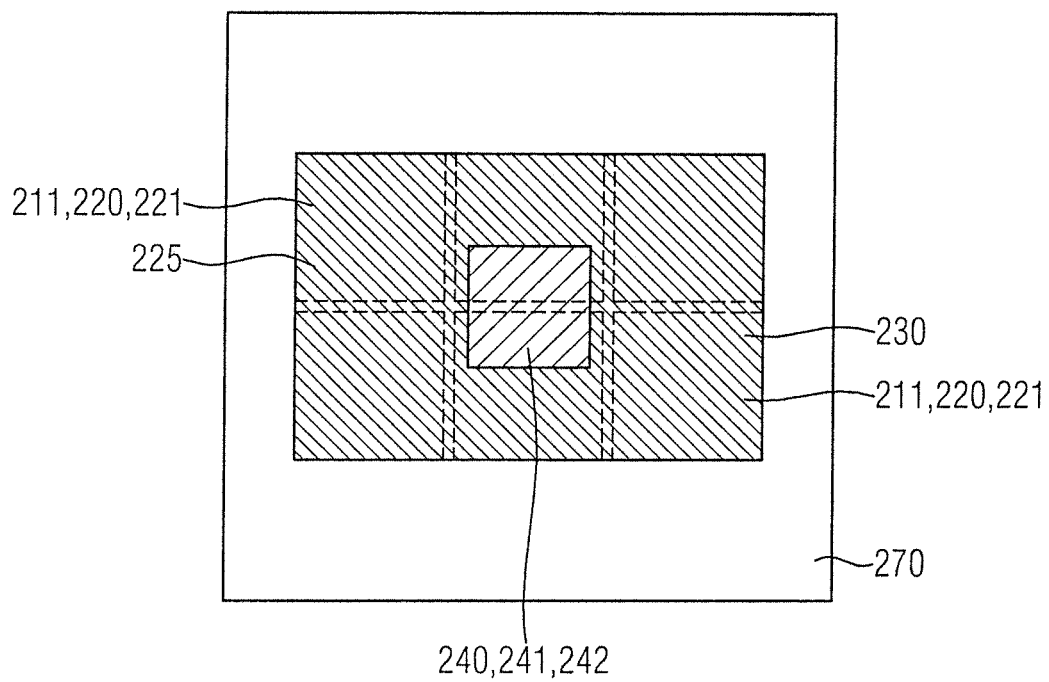
FIGS. 24 and 25 show plan view illustrations showing different configurations of the component from FIG. 23.

The further construction of the radiation-emitting component 206 shown in FIGS. 23 and 24 corresponds to the component 202. In this regard, the component 206 comprises an optical waveguide 230 arranged on the semiconductor chips 211 and optically connected to the semiconductor layer sequences of the semiconductor chips 211 via a radiation-transmissive material 250. The radiation surfaces 211 and thus an emission surface 225 composed of the radiation surfaces are completely covered by the optical waveguide 230. A conversion element 240 is arranged centrally on the optical waveguide 230. In the configuration shown, only two of the semiconductor chips 211 are covered by the conversion element 240. The arrangement comprising the semiconductor chips 211, the optical waveguide 230 and the conversion element 240 is furthermore surrounded by a reflective plastics material 260 such that a front-side radiation surface 242 of the conversion element 240 remains free.

Figure 25:
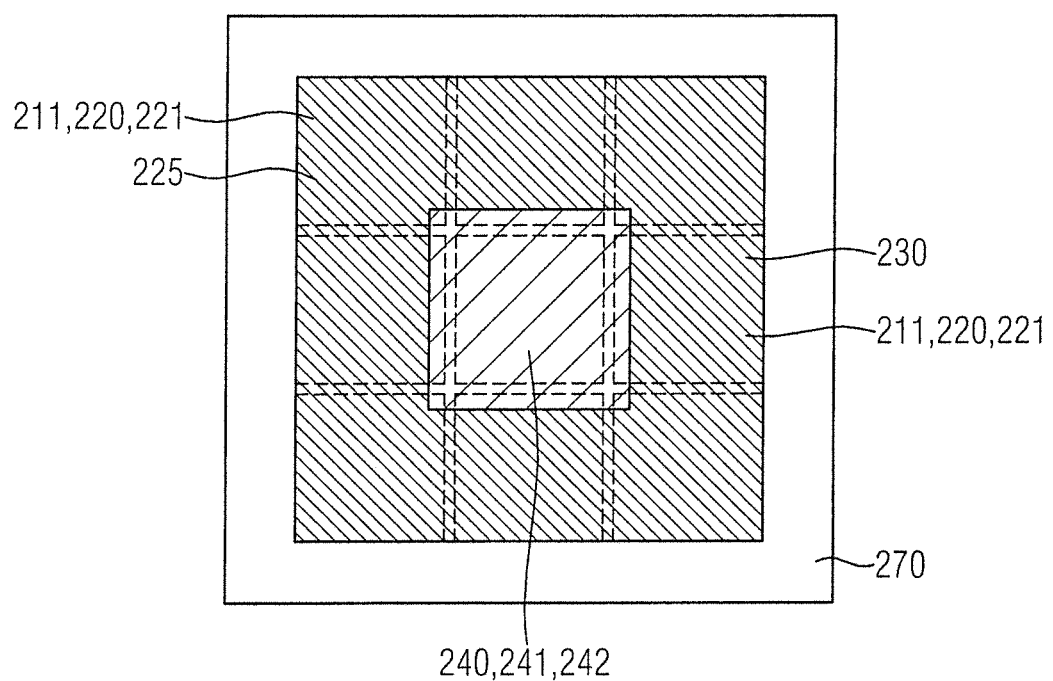

FIG. 25 shows, in a plan view illustration, one possible modified configuration which may be considered for the radiation-emitting component 206. In this case, the component 206 comprises nine semiconductor chips 211 arranged next to one another in a rectangular grid. The conversion element 240 arranged centrally on the optical waveguide 230 is of such a size that the conversion element 240 completely covers a central semiconductor chip 211 and partly covers the remaining semiconductor chips 211.

Figure 26:
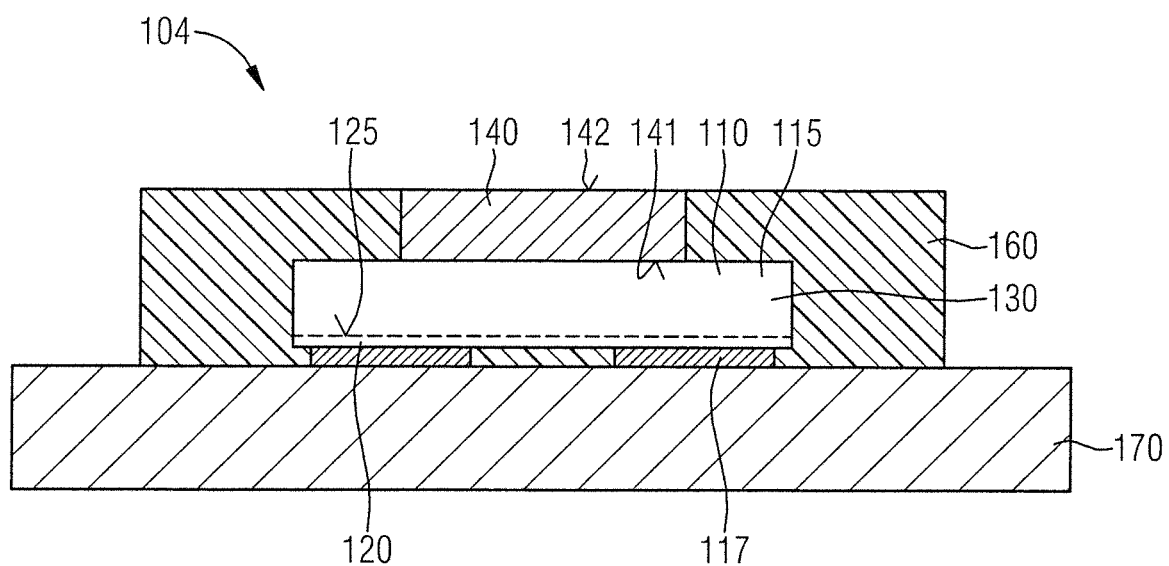
FIG. 26 shows a lateral illustration of a radiation-emitting component including a volume-emitting flip-chip.

A construction comprising only one semiconductor chip comprising a radiation-generating semiconductor layer sequence may be considered for radiation-emitting components. In this sense, FIG. 26 shows a lateral sectional illustration of a further radiation-emitting component 104. The component 104 comprises a volume-emitting flip-chip 110 arranged on a carrier 170. The semiconductor chip 110 comprises a radiation-transmissive chip substrate 125 composed of sapphire, for example, the chip substrate serving as an optical waveguide device 130, and a single semiconductor layer sequence 120 arranged on the chip substrate 125. The light radiation generated in the semiconductor layer sequence 120 may be emitted via an emission surface 125 and be coupled into the chip substrate 115 directly adjoining the latter. Via two rear-side contacts 117, the semiconductor chip 110 is connected to mating contacts (not illustrated) of the carrier 170. A conversion element 140 is arranged on the chip substrate 115, and optically coupled to the chip substrate 115. The component 104 further comprises a reflective plastics material 160 arranged on the carrier 170 and surrounding the abovementioned constituent parts 110, 140 such that a radiation surface 142 of the conversion element 140 is not covered. The emission surface 125 is significantly larger than an input surface 141 of the conversion element 140, the input surface facing the chip substrate 115 such that radiation may be emitted from the radiation surface 142 with a high luminance.

Figure 27:
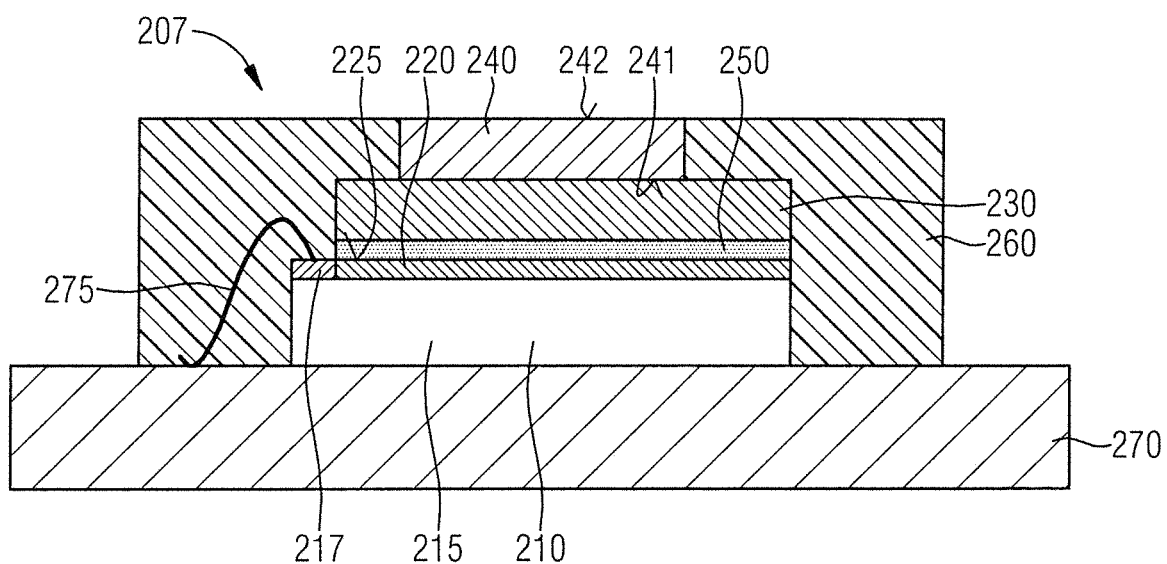
FIG. 27 shows a lateral illustration of a radiation-emitting component including a surface-emitting semiconductor chip.

The abovementioned approach is also possible with regard to surface emitters. For illustration, FIG. 27 shows a lateral sectional illustration of a further radiation-emitting component 207. The component 207 comprises a surface-emitting semiconductor chip 210 arranged on a carrier 270. The semiconductor chip 210 comprises a chip substrate 215, a semiconductor layer sequence 220 arranged thereon, and also a front-side contact 217 and a rear-side contact (not illustrated) electrically connected to mating contacts (not illustrated) of the carrier 270. An optical waveguide 230 is arranged on the semiconductor chip 210, the optical waveguide being optically connected to the semiconductor layer sequence 220 via a radiation-transmissive material 250. The light radiation generated in the semiconductor layer sequence 220 may be emitted via an emission surface 225 and coupled into the optical waveguide 230. A conversion element 240 is arranged on the optical waveguide 230, and optically coupled to the optical waveguide 230. The component 207 further comprises a reflective plastics material 260 arranged on the carrier 270 and surrounding the abovementioned constituent parts 210, 230, 240 such that a radiation surface 242 of the conversion element 240 is not covered. The emission surface 225 is significantly larger than an input surface 241 of the conversion element 240, the input surface facing the optical waveguide 230 such that radiation may be emitted from the radiation surface 242 with a high luminance.

Besides the examples depicted and described above, further examples are possible, which may comprise further modifications and/or combinations of features.

It is possible, for example, to realize components comprising numbers and/or geometric arrangements of semiconductor chips 110, 111, 210, 211 and conversion elements 140, 240 that deviate from the configurations shown in the figures. Correspondingly, optical waveguides 230, 231, 232 comprising plan view shapes coordinated therewith may be used. If semiconductor chips 210 comprising contacts 217 at corners are used (cf. FIG. 12), the optical waveguides may comprise corresponding cutouts 235.

With regard to combinations of configurations, it is possible, for example, to provide the use of a reflective coating 160 instead of a reflective plastics material, as was explained with reference to FIG. 7, also in the components comprising surface-emitting semiconductor chips 210, 211 as explained with reference to the subsequent FIGS. 8 to 25. In this case, semiconductor chips 210, 211 circumferentially, an optical waveguide 230, 231, 232 at a front side in a region next to a conversion element 240, and an optical waveguide 230 additionally circumferentially, and also the conversion element 240 circumferentially may be covered with a reflective coating 161. Correspondingly modified configurations comprising such a coating 161 may be considered for the components shown in FIGS. 26 and 27.

In the components comprising a plurality of volume-emitting semiconductor chips 110 as shown in the figures, all the semiconductor chips 110 are partly covered by a conversion element 140 (cf. FIGS. 2, 3, 5 and 6). However, configurations of components are also possible, if appropriate with a greater number of semiconductor chips 110, in which not all of the semiconductor chips 110 optically coupled by a transparent material 150 are partly covered by a conversion element 140. In this regard, by way of example, a configuration corresponding to FIG. 24 may be considered.

A further possible modification consists, for example, in using, in the component comprising the heat dissipating elements 280 as explained with reference to FIG. 20, an optical waveguide comprising a cross-sectional shape tapering in the direction of the conversion element 240. This is also possible in other components, for example, in the component from FIG. 27. Furthermore, configurations comprising heat dissipating elements may be provided for all of the components shown comprising an optical waveguide 230, 231, 232, for example, the components shown in FIGS. 23 and 27.

With regard to bringing about an additional heat dissipation, components may furthermore be considered which comprise a different number of heat dissipating elements, or else just one heat dissipating element. Such a heat dissipating element may furthermore be configured in the shape of a frame, for example, and enclose one or more semiconductor chips.

Modifications are also possible with regard to a radiation conversion and a conversion element 140, 240. By way of example, a conversion element 140, 240 may be used with the aid of which a blue primary radiation is substantially completely converted into a green or red light radiation, for example. Instead of a ceramic conversion element, a conversion element 140, 240 may be used that comprises a matrix material, for example, a silicone or glass material, and conversion particles embedded therein. A further possible modification consists in realizing a conversion element 140, 240 in the form of a layer applied directly on an optical waveguide device 130 comprising at least one chip substrate 115 or on an optical waveguide 230, 231, 232. One example involves spraying on a silicone material comprising conversion particles contained therein (spray coating).

An optical waveguide 230, 231, 232 may be configured from other materials besides the abovementioned materials (sapphire, glass). They include, for example, a radiation-transmissive ceramic material. Furthermore, if a ceramic conversion element 240 is used, it is possible to equip a component with a combined and jointly produced ceramic element comprising an optical waveguide 230, 231, 232 and a conversion element 240 arranged thereon.

Although my components have been more specifically illustrated and described in detail by preferred examples, nevertheless this disclosure is not restricted by the examples disclosed and other variations may be derived therefrom by those skilled in the art, without departing from the scope of protection of the appended claims.

This application claims priority of DE 10 2016 109 308.4, the subject matter of which is incorporated herein by reference.

The invention claimed is:

1. A radiation-emitting component comprising:
a radiation source comprising at least one semiconductor layer sequence that generates radiation;
an optical waveguide device disposed downstream of the radiation source;
a conversion element for radiation conversion disposed downstream of the optical waveguide device; and
a reflective material arranged circumferentially with respect to the conversion element,
wherein radiation is emittable from the radiation source via an emission surface and couplable into the optical waveguide device,
radiation is couplable from the optical waveguide device into the conversion element via an input surface, and
the emission surface of the radiation source is larger than the input surface of the conversion element.

2. The radiation-emitting component according to claim 1, wherein the input surface of the conversion element and the emission surface of the radiation source comprise a size ratio of at most 75%.

3. The radiation-emitting component according to claim 1,
wherein the radiation source comprises a plurality of semiconductor layer sequences that generate radiation arranged next to one another,
radiation of the semiconductor layer sequences is each emittable via a radiation surface and couplable into the optical waveguide device, and
the emission surface of the radiation source is composed of the radiation surfaces of the semiconductor layer sequences.

4. The radiation-emitting component according to claim 1,
wherein the radiation-emitting component comprises a radiation-emitting semiconductor chip,
the semiconductor chip is configured as a volume-emitting flip-chip,
the semiconductor chip comprises the at least one semiconductor layer sequence of the radiation source and a radiation-transmissive chip substrate, and
the optical waveguide device is constituted of the radiation-transmissive chip substrate.

5. The radiation-emitting component according to claim 4, wherein the reflective material is arranged circumferentially with respect to the semiconductor chip and at a front side of the semiconductor chips in a region next to the conversion element.

6. The radiation-emitting component according to claim 1,
wherein the radiation-emitting component comprises a plurality of radiation-emitting semiconductor chips arranged next to one another,
the plurality of semiconductor chips are configured as volume-emitting flip-chips, the plurality of semiconductor chips each comprise a semiconductor layer sequence of the radiation source and a radiation-transmissive chip substrate, and the optical waveguide device comprises the radiation-transmissive chip substrates of the plurality of semiconductor chips.

7. The radiation-emitting component according to claim 6, further comprising a radiation-transmissive material arranged between the plurality of semiconductor chips.

8. The radiation-emitting component according to claim 6, wherein the reflective material is arranged circumferentially with respect to the plurality of semiconductor chips and at front sides of the plurality of semiconductor chips in a region next to the conversion element.

9. The radiation-emitting component according to claim 1,
wherein the radiation-emitting component comprises a plurality of radiation-emitting semiconductor chips arranged next to one another,
the plurality of semiconductor chips are configured as surface-emitting semiconductor chips,
the plurality of semiconductor chips each comprise a semiconductor layer sequence of the radiation source, and
the optical waveguide device is configured in the form of an optical waveguide arranged on the plurality of semiconductor chips.

10. The radiation-emitting component according to claim 9, wherein at least one of the following is present:
the reflective material is arranged at a front side of the optical waveguide in a region next to the conversion element, and the optical waveguide comprises a shape tapering in the direction of the conversion element.

11. The radiation-emitting component according to claim 9, further comprising at least one heat dissipating element thermally coupled to the optical waveguide to dissipate heat from the optical waveguide.

12. The radiation-emitting component according to claim 9, further comprising a heat dissipating element thermally coupled to the optical waveguide to dissipate heat from the optical waveguide,
wherein the optical waveguide is arranged on the heat dissipating element, and
a reflective layer is provided between the optical waveguide and the heat dissipating element in order to avoid absorption of radiation at the heat dissipating element.

13. The radiation-emitting component according to claim 12, wherein at least one of the following is present:
the reflective layer comprises a plurality of mirror layers; and
the heat dissipating element is formed from a metallic material.

14. The radiation-emitting component according to claim 1,
wherein the radiation-emitting component comprises a radiation-emitting semiconductor chip,
the semiconductor chip is configured as a surface-emitting semiconductor chip,
the semiconductor chip comprises the semiconductor layer sequence of the radiation source, and
the optical waveguide device is configured in the form of an optical waveguide arranged on the semiconductor chip.

15. The radiation-emitting component according to claim 14, further comprising at least one heat dissipating element thermally coupled to the optical waveguide to dissipate heat from the optical waveguide.

16. The radiation-emitting component according to claim 14, further comprising a heat dissipating element thermally coupled to the optical waveguide to dissipate heat from the optical waveguide,
wherein the optical waveguide is arranged on the heat dissipating element, and
a reflective layer is provided between the optical waveguide and the heat dissipating element to avoid absorption of radiation at the heat dissipating element.

17. The radiation-emitting component according to claim 16, wherein at least one of the following is present:
the reflective layer comprises a plurality of mirror layers; and
the heat dissipating element is formed from a metallic material.

18. The radiation-emitting component according to claim 1, comprising a plastics material comprising reflective particles that surround the arrangement comprising the radiation source, the optical waveguide device and the conversion element, wherein a front-side radiation surface of the conversion element is not covered with the plastics material.

19. A radiation-emitting component comprising:
a radiation source comprising at least one semiconductor layer sequence that generates radiation;
an optical waveguide device disposed downstream of the radiation source; and
a conversion element for radiation conversion disposed downstream of the optical waveguide device,
wherein radiation is emittable from the radiation source via an emission surface and couplable into the optical waveguide device,
radiation is couplable from the optical waveguide device into the conversion element via an input surface,
the emission surface of the radiation source is larger than the input surface of the conversion element,
the radiation source comprises a plurality of semiconductor layer sequences that generate radiation arranged next to one another,
radiation of the semiconductor layer sequences is each emittable via a radiation surface and couplable into the optical waveguide device, and
the emission surface of the radiation source is composed of the radiation surfaces of the semiconductor layer sequences.

20. A radiation-emitting component comprising:
a radiation source comprising at least one semiconductor layer sequence that generates radiation;
an optical waveguide device disposed downstream of the radiation source; and
a conversion element for radiation conversion disposed downstream of the optical waveguide device,
wherein radiation is emittable from the radiation source via an emission surface and couplable into the optical waveguide device,
radiation is couplable from the optical waveguide device into the conversion element via an input surface,
the emission surface of the radiation source is larger than the input surface of the conversion element,
the radiation-emitting component comprises a radiation-emitting semiconductor chip,
the semiconductor chip is configured as a volume-emitting flip-chip,
the semiconductor chip comprises the at least one semiconductor layer sequence of the radiation source and a radiation-transmissive chip substrate, and
the optical waveguide device is constituted of the radiation-transmissive chip substrate.

21. A radiation-emitting component comprising:
a radiation source comprising at least one semiconductor layer sequence that generates radiation;
an optical waveguide device disposed downstream of the radiation source; and
a conversion element for radiation conversion disposed downstream of the optical waveguide device,
wherein radiation is emittable from the radiation source via an emission surface and couplable into the optical waveguide device,
radiation is couplable from the optical waveguide device into the conversion element via an input surface,
the emission surface of the radiation source is larger than the input surface of the conversion element,
the radiation-emitting component comprises a plurality of radiation-emitting semiconductor chips arranged next to one another,
the plurality of semiconductor chips are configured as surface-emitting semiconductor chips,
the plurality of semiconductor chips each comprise a semiconductor layer sequence of the radiation source,
the optical waveguide device is configured in the form of an optical waveguide arranged on the plurality of semiconductor chips,
the radiation-emitting component further comprises a heat dissipating element thermally coupled to the optical waveguide to dissipate heat from the optical waveguide,
the optical waveguide is arranged on the heat dissipating element, and
a reflective layer is provided between the optical waveguide and the heat dissipating element in order to avoid absorption of radiation at the heat dissipating element.

22. A radiation-emitting component comprising:
a radiation source comprising at least one semiconductor layer sequence that generates radiation;
an optical waveguide device disposed downstream of the radiation source; and
a conversion element for radiation conversion disposed downstream of the optical waveguide device,
wherein radiation is emittable from the radiation source via an emission surface and couplable into the optical waveguide device,
radiation is couplable from the optical waveguide device into the conversion element via an input surface,
the emission surface of the radiation source is larger than the input surface of the conversion element,
the radiation-emitting component comprises a radiation-emitting semiconductor chip,
the semiconductor chip is configured as a surface-emitting semiconductor chip,
the semiconductor chip comprises the semiconductor layer sequence of the radiation source,
the optical waveguide device is configured in the form of an optical waveguide arranged on the semiconductor chip,
the radiation-emitting component further comprises a heat dissipating element thermally coupled to the optical waveguide to dissipate heat from the optical waveguide,
the optical waveguide is arranged on the heat dissipating element, and
a reflective layer is provided between the optical waveguide and the heat dissipating element to avoid absorption of radiation at the heat dissipating element.

* * * * *